(12) United States Patent
Wang et al.

(10) Patent No.: US 12,189,284 B2
(45) Date of Patent: Jan. 7, 2025

(54) METHOD FOR FORMING SEMICONDUCTOR DEVICE

(71) Applicant: TAIWAN SEMICONDUCTOR MANUFACTURING COMPANY, LTD., Hsinchu (TW)

(72) Inventors: Sheng-Min Wang, New Taipei (TW); Ken-Hsien Hsieh, Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 627 days.

(21) Appl. No.: 17/372,076

(22) Filed: Jul. 9, 2021

(65) Prior Publication Data

US 2022/0283494 A1 Sep. 8, 2022

Related U.S. Application Data

(60) Provisional application No. 63/157,502, filed on Mar. 5, 2021.

(51) Int. Cl.
| | |
|---|---|
| *G03F 1/70* | (2012.01) |
| *G03F 1/22* | (2012.01) |
| *G03F 7/20* | (2006.01) |
| *H01L 21/3213* | (2006.01) |
| *H01L 21/768* | (2006.01) |

(52) U.S. Cl.
CPC .............. *G03F 1/70* (2013.01); *G03F 1/22* (2013.01); *H01L 21/32139* (2013.01); *H01L 21/7684* (2013.01); *H01L 21/76877* (2013.01); *G03F 7/2004* (2013.01)

(58) Field of Classification Search
CPC . G03F 1/70; G03F 1/22; G03F 7/2004; G03F 1/36; G03F 1/76; G03F 7/70258; G03F 7/70425; H01L 21/32139; H01L 21/7684; H01L 21/76877; H01L 21/0274; H01L 21/31053; H01L 21/3212; H01L 21/76885; H01L 23/522
See application file for complete search history.

(56) References Cited

U.S. PATENT DOCUMENTS 8,612,904 B1 * 12/2013 Wang .................. G03F 7/70566
716/51
8,826,198 B2 * 9/2014 Tsai ........................ G06F 30/00
716/54

(Continued)

*Primary Examiner* — Nghia M Doan
(74) *Attorney, Agent, or Firm* — Maschoff Brennan

(57) ABSTRACT

A method comprises generating an original layout having main pattern sets; simulating a first energy distribution of the original layout on a pupil plane of a lithography system, wherein the first energy distribution has a first wavefront; generating a first modified layout by inserting dummy pattern sets in regions of the original layout that are not occupied by the main pattern sets; simulating a second energy distribution of the first modified layout on a pupil plane of a lithography system; determining whether a second wavefront of the simulated second energy distribution is more homogeneous than the first wavefront of the first energy distribution; and performing a first lithography process using a first photomask having the first modified layout in response to second wavefront of the simulated second energy distribution being determined as more homogeneous than the first wavefront of the first energy distribution.

20 Claims, 15 Drawing Sheets

(56) References Cited

U.S. PATENT DOCUMENTS 10,139,723 B2 * 11/2018 Wei .......................... G03F 1/84
2003/0149956 A1 * 8/2003 Singh ...................... G03F 7/705
716/51

* cited by examiner

METHOD FOR FORMING SEMICONDUCTOR DEVICE

PRIORITY CLAIM AND CROSS-REFERENCE

The present application claims priority to U.S. Provisional Application Ser. No. 63/157,502, filed Mar. 5, 2021, which is herein incorporated by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing. For these advances to be realized, similar developments in IC processing and manufacturing are needed. For example, the need to perform higher resolution lithography processes grows.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
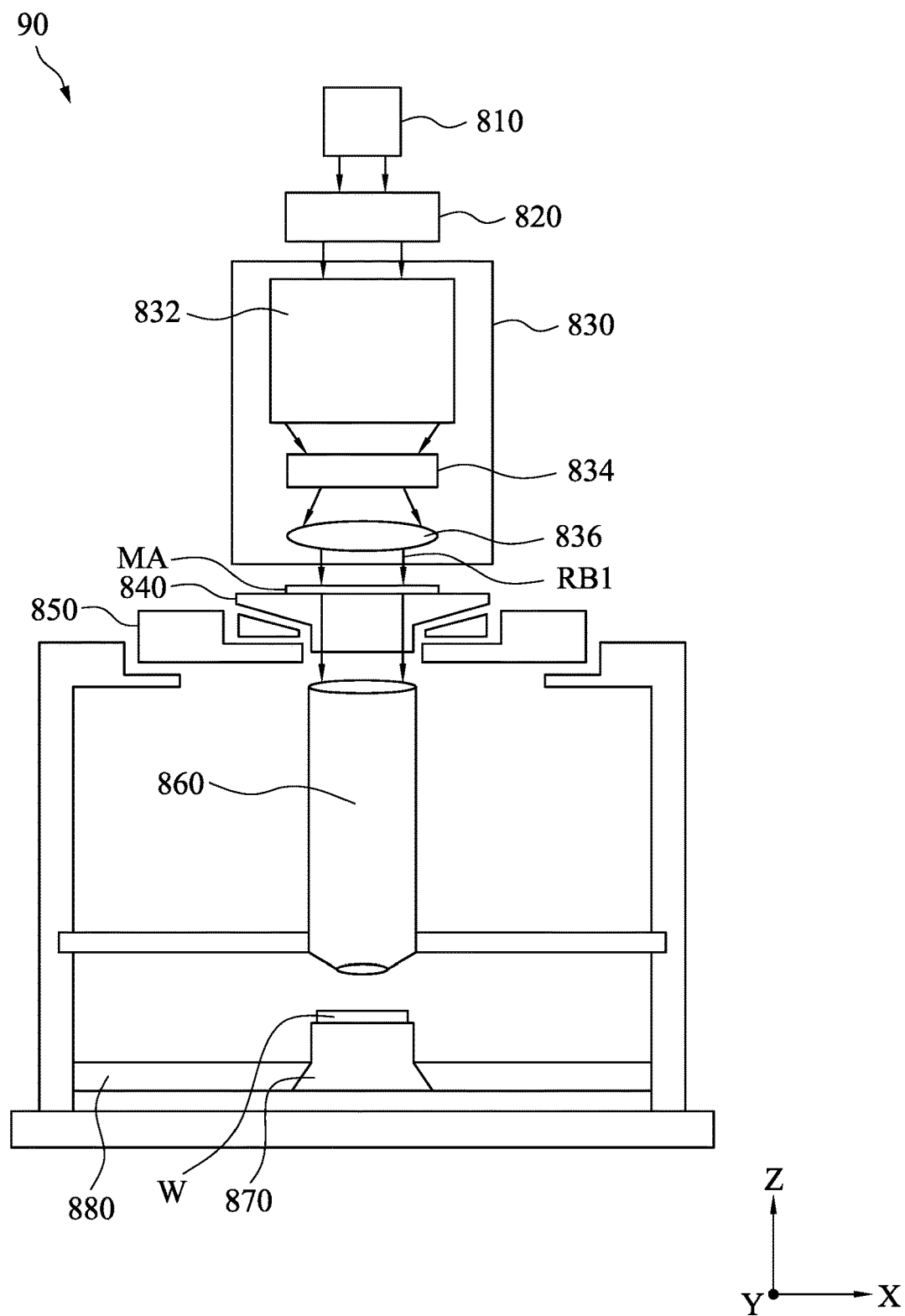
FIG. 1 is a schematic view of lithography system in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 schematically illustrates a lithographic system according to some embodiments of the present disclosure. Shown there is a DUV lithography system 90. The lithography system 90 includes an illumination system (illuminator) 830 configured to condition a radiation beam RB1 (e.g., DUV radiation or any other suitable radiation), a support structure (e.g., a photomask table) 840 constructed to support a photomask MA and connected to a first positioning device (also referred to as a photomask positioning device) 850 configured to accurately position the photomask MA in accordance with certain parameters. The lithography system 90 also includes a substrate table (e.g., a wafer table) 870 or "substrate support" constructed to hold a substrate (e.g., a resist-coated wafer) W and connected to a second positioning device (also referred to as a wafer positioning device) 880 configured to accurately position the substrate W in accordance with certain parameters. In some embodiments, the wafer table 870 can be referred to as a holding device because it can hold the wafer W. The lithography system 90 further includes a projection system (e.g., a refractive projection lens system) 860 configured to project a pattern imparted to the radiation beam RB1 by photomask MA onto a target place of the substrate W.

In some embodiments, the illumination system 830 may include various types of optical components, such as refractive, reflective, magnetic, electromagnetic, electrostatic or other types of optical components, or any combination thereof, for directing, shaping, or controlling radiation beam RB1.

The support structure 840 supports, i.e., bears the weight of, the photomask MA. In some embodiments, the support structure 840 can use mechanical, vacuum, electrostatic or other clamping techniques to hold the photomask MA. The support structure 840 may be a frame or a table, for example, which may be fixed or movable. The support structure 840 may ensure that the photomask MA is at a desired position, for example with respect to the projection system 860.

In some embodiments, the photomask MA is any device that can be used to impart a radiation beam with a pattern in its cross-section so as to create a pattern in the substrate W (i.e., wafer). It is noted that the pattern imparted to the radiation beam RB1 may not exactly correspond to the desired pattern in the substrate W, for example if the pattern includes phase-shifting features. Generally, the pattern imparted to the radiation beam RB1 will correspond to a particular functional layer in a device being created in the substrate W, such as an integrated circuit.

The photomask MA may be transmissive or reflective. Examples of patterning devices MA include photomasks (also referred to as reticles), programmable mirror arrays, and programmable LCD panels. Masks include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

In some embodiments, the projection system 860 is any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum.

As here depicted, the lithographic system 90 is of a transmissive type (e.g., employing a transmissive photomask). Alternatively, the lithographic system 90 may be of a reflective type (e.g., employing a programmable mirror array, or employing a reflective photomask).

The lithographic system 90 may be of a type having two (dual stage) or more substrate tables or "substrate supports" (and/or two or more photomask tables or "photomask supports"). In such "multiple stage" machines, the additional tables or supports may be used in parallel, or preparatory steps may be carried out on one or more tables or supports while one or more other tables or supports are being used for exposure.

The lithographic system 90 may also be of a type wherein at least a portion of the substrate W may be covered by a liquid having a relatively high refractive index, e.g., water, so as to fill a space between the projection system 860 and the substrate W. An immersion liquid may also be applied to other spaces in the lithographic system 90, for example, between the photomask MA and the projection system 860. Immersion techniques can be used to increase the numerical aperture of projection systems. The term "immersion" as used herein does not mean that the substrate W must be submerged in liquid, but rather only means that a liquid is located between the projection system 860 and the substrate W during exposure.

Referring to FIG. 1, the illuminator 830 receives a radiation beam RB1 from a radiation source 810. The radiation source and the lithographic system 90 may be separate entities, for example when the radiation source is an excimer laser. In such cases, the radiation source 810 is not considered to form part of the lithographic system and the radiation beam RB1 is passed from the source 810 to the illuminator 830 with the aid of a beam delivery system 820 including, for example, suitable directing mirrors and/or a beam expander. In other cases, the radiation source 810 may be an integral part of the lithographic system 90, for example when the radiation source 810 is a mercury lamp. The source 810 and the illuminator 830, together with the optional beam delivery system 820, may be referred to as a radiation system.

In some embodiments, the illuminator 830 may include an adjuster 832 configured to adjust the angular intensity distribution of the radiation beam RB1. Generally, at least the outer and/or inner radial extent (commonly referred to as σ-outer and σ-inner, respectively) of the intensity distribution in a pupil plane of the illuminator 830 can be adjusted. In addition, the illuminator 830 may include various other components, such as an integrator 834 and a condenser 836. The illuminator 830 may be used to condition the radiation beam RB1, to have a desired uniformity and intensity distribution.

The radiation beam RB1 is incident on the photomask MA, which is held on the photomask positioning device 850, and is patterned by the photomask MA. Having traversed the photomask MA, the radiation beam RB1 passes through the projection system 860, which focuses the radiation beam RB1 onto a target portion of the wafer W on the wafer table 870. With the aid of the wafer positioning device 850, the wafer table 870 can be moved accurately, e.g., so as to position different target portions of the wafer in the path of the radiation beam RB1. Similarly, the photomask positioning device 850 can be used to accurately position the photomask MA with respect to the path of the radiation beam RB1, e.g., after mechanical retrieval from a photomask library, or during a scan. In general, movement of the photomask table 840 may be realized with the aid of a long-stroke module (coarse positioning) and a short-stroke module (fine positioning), which form part of the photomask positioning device 850. Similarly, movement of the wafer table 870 may be realized using the wafer positioning device 880. In the case of a stepper (as opposed to a scanner), the photomask table 840 may be connected to a short-stroke actuator only, or may be fixed. Photomask MA on the photomask table 840 and the wafer W on the wafer table 870 may be aligned using photomask alignment marks on the photomask MA and wafer alignment marks on the wafer W.

Figure 2:
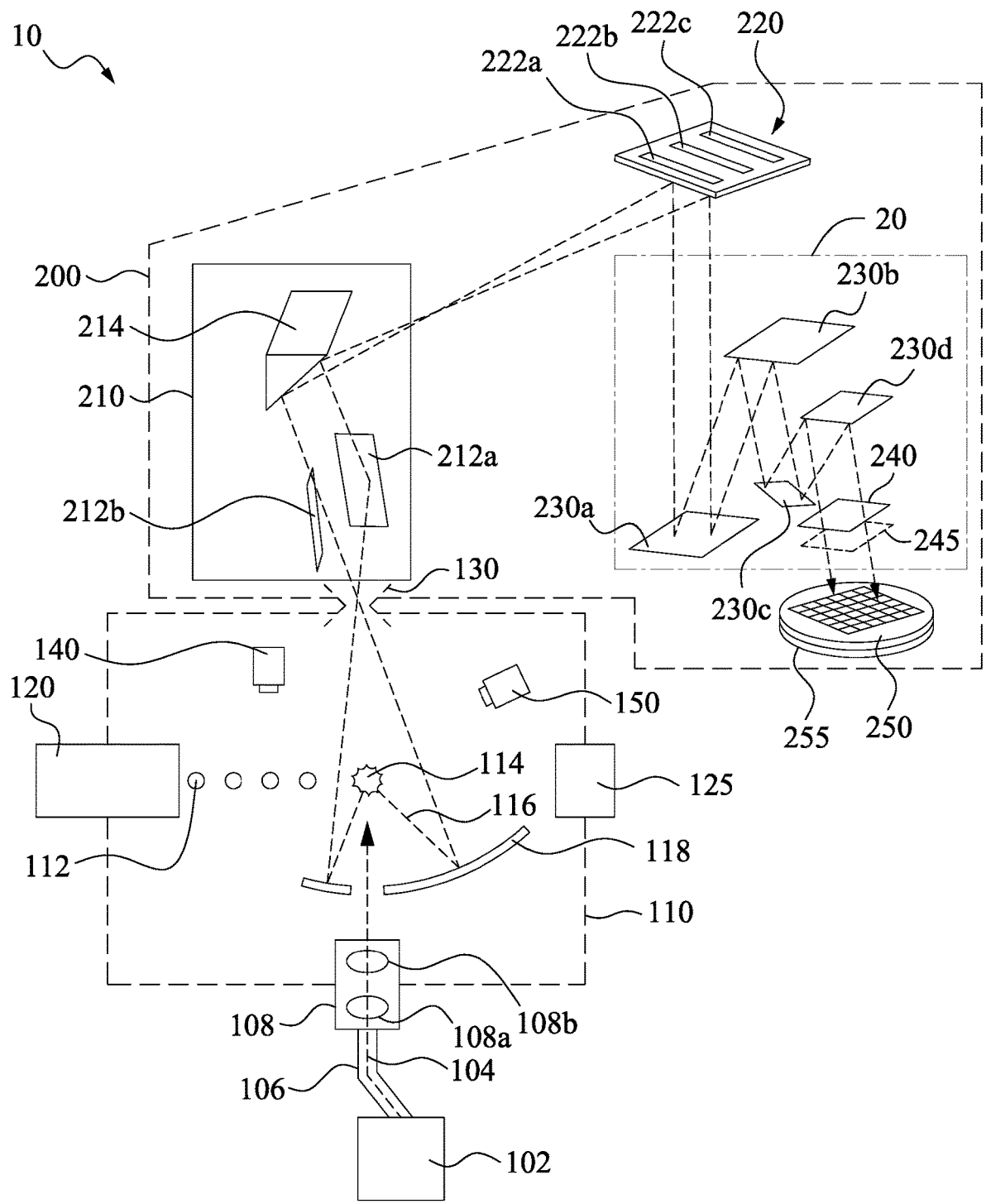
FIG. 2 is a schematic view of lithography system in accordance with some embodiments of the present disclosure.

FIG. 2 is a schematic view of lithography system in accordance with some embodiments of the present disclosure. Shown there is a EUV lithography system 10. Although the EUV lithography system 10 is illustrated as having a certain configuration of components, it will be appreciated that the disclosed lithography system 10 may include additional components (e.g., additional mirrors) or having less components (e.g., less mirrors).

The EUV lithography system 10 includes a EUV source vessel 110. A fuel droplet generator 120 is connected to the EUV source vessel 110 and is configured to generate a plurality of fuel droplets 112. In some embodiments, the fuel droplets 112 generated by the fuel droplet generator 120 are provided into the EUV source vessel 110. In some embodiments, the fuel droplets 112 may include tin (Sn). In other embodiments, the fuel droplets 112 may include a different metal material. In some embodiments, the EUV source vessel 110 can also be referred to as a radiation source, in which radiation source employs a laser produced plasma (LPP) mechanism to generate plasma and further generate EUV light from the plasma.

The EUV lithography system 10 may also include a droplet position detection system which may include a droplet imager 140 disposed in the EUV source vessel 110 that captures an image of one or more fuel droplets 112. The droplet imager 140 may provide this captured image to a droplet position detection feedback system (not shown), which can, e.g., generate a droplet position and trajectory in response to an analysis result of the captured image. The position detection feedback system can thus generate a droplet error in response to the generated droplet position and trajectory, e.g., based on a droplet-by-droplet basis, or on average. In some embodiments, the droplet imager 140 may include a fine droplet steering camera (FDSC), a droplet formation camera (DFC), and/or suitable devices.

The EUV lithography system 10 further includes a primary laser having a laser source 102 configured to produce a laser beam 104. In some embodiments, the laser source 102 may include a multi-stage laser having a plurality of stages configured to amplify laser light produced by a prior stage. The laser beam 104 passes through a beam transport system 106 configured to provide the laser beam to a focusing system 108. The focusing system 108 includes one or more lenses 108a, 108b and/or mirrors arranged within a beam line and configured to focus the laser beam 104. The laser beam 104 is output from the focusing system 108 to the EUV source vessel 110.

The laser beam 104 transmits through a collector mirror 118 located within the EUV source vessel 110. Then, the primary laser beam 104 generated by the laser source 102 intersects the fuel droplets 112. In some embodiments, the primary laser beam 104 may be a carbon dioxide ($CO_2$) laser. In other embodiments, the primary laser beam 104 may include alternative types of lasers. When the primary laser beam 104 strikes the fuel droplets 112, the primary laser beam 104 heats the fuel droplets 112 to a temperature. At the temperature, the fuel droplets 112 shed their electrons and become a plasma 114 including a plurality of ions. In some embodiments, the ions emit EUV radiation 116 (e.g., having a wavelength of approximately 13.3 nm to about 13.7 nm).

In some embodiments, the collector mirror 118 has a concave curvature. In some embodiments, the collector mirror 118 may include a multi-layer coating having alternating layers of different materials. For example, in some embodiments, the collector mirror 118 may include alternating layers of molybdenum and silicon configured to operate as a Bragg reflector. The concave curvature of the collector mirror 118 focuses the EUV radiation 116 generated by the plasma 114 toward an intermediate focus (IF) unit 130 within an exit aperture of the EUV source vessel 110. The intermediate focus unit 130 is located between the EUV source vessel 110 and a scanner 200 including optical elements configured to direct the EUV radiation 116 to a workpiece (e.g., a semiconductor substrate). In some embodiments, the intermediate focus unit 130 may include a cone shaped aperture configured to provide for separation of pressures between the EUV source vessel 110 and the scanner 200. In some embodiments, the intermediate focus unit 130 may extend into the scanner 200.

The EUV lithography system 10 may also include an EUV energy monitor 150 disposed in the EUV source vessel 110. The EUV energy monitor 150 is designed to monitor the EUV intensity or energy generated from the EUV source vessel 110. For example, the EUV energy monitor 150 includes an EUV sensing element, such as a diode, designed to be sensitive to the EUV light and configured to effectively detect the EUV light. In other examples, the EUV energy monitor 150 includes a plurality of diodes configured in an array to effectively detect the EUV light for monitoring purpose. In some embodiments, a dose error is calculated based on the sensed EUV intensity (or energy). For example, when the sensed EUV intensity (or energy) is below a predetermined threshold value, such situation can be referred to as a dose error. Generally, the dose error is related to the plasma instability, through monitoring the EUV intensity by the EUV energy monitor 150, the dose error can be extracted from the monitored EUV intensity. Therefore, when a dose error is occurred, it indicates that the plasma 114 is unstable.

In some embodiments, the EUV lithography system further includes a droplet collection element 125 disposed in the EUV source vessel 110 and located opposite to the droplet generator 120. The droplet collection element 125 is configured to collect fuel droplets 112 that are not vaporized during formation of the EUV radiation 116 and/or fragments of fuel droplets 112 generated during formation of the EUV radiation 116.

The EUV radiation 116 output from the EUV source vessel 110 is provided to a condenser 210 by way of the intermediate focus unit 130. In some embodiments, the condenser 210 includes first and second surfaces 212a and 212b configured to focus the EUV radiation 116, and a reflector 214 configured to reflect the EUV radiation 116 towards a photomask 220. The photomask 220 is configured to reflect the EUV radiation 116 to form a pattern on a surface of a wafer 250. To produce the pattern, the photomask 220 may include a plurality of absorptive features 222a, 222b, and 222c arranged on a front surface of the photomask 220. The plurality of absorptive features 222a, 222b, and 222c are configured to absorb the EUV radiation 116, such that the reflected rays of EUV radiation 116 conveys a pattern defined by the photomask 220.

The lithography system 10 also includes a projection optics module (or projection optics box (POB) 20 for imaging the pattern of the photomask 220 on a target (e.g., wafer 250). The POB 20 has refractive optics (such as for UV lithography system) or alternatively reflective optics (such as for EUV lithography system) in various embodiments. The light directed from the photomask 220, diffracted into various diffraction orders and carrying the image of the pattern defined on the mask, is collected by the POB 20. The POB 20 may include a magnification of less than one (thereby the size of the "image" on a target (such as the wafer 250) is smaller than the size of the corresponding "object" on the mask).

In some embodiments, the POB 20 conveys the EUV radiation 116 onto a layer of photoresist disposed on a surface of the wafer 250. The EUV radiation 116 irradiates particular regions of the layer of photoresist based on the pattern carried by the EUV radiation 116, and thus the layer of irradiated photoresist layer can be patterned after developing it. Therefore, subsequent processing can be performed on selected regions of the wafer 250.

In some embodiments, the EUV radiation 116 is filtered through POB 20 including a series of first to fourth mirrors 230a, 230b, 230c, and 230d, which serve as lenses to reduce a size of the pattern carried by the EUV radiation 116.

The lithography system 10 also includes a pupil phase modulator 240 to modulate optical phase of the EUV radiation 116 directed from the photomask 220 so that the EUV radiation 116 has a phase distribution on a projection pupil plane 245. In the optical module, there is a plane with field distribution corresponding to Fourier Transform of the object (the photomask 220 in the present case). This plane is referred to as projection pupil plane. The pupil phase modulator 240 provides a mechanism to modulate the optical phase of the EUV radiation 116 on the projection pupil plane 245. In some embodiments, the pupil phase modulator 240 includes a mechanism to tune the reflective mirrors 230a, 230b, 230c, and 230d of the POB 20 for phase modulation. For example, the mirrors 230a, 230b, 230c, and 230d of the POB 20 are switchable and are controlled to reflect the EUV light, thereby modulating the phase of the light through POB 20.

In some embodiments, the pupil phase modulator 240 utilizes a pupil filter placed on the projection pupil plane. A pupil filter filters out specific spatial frequency components of the EUV radiation 116 from the photomask 220. The pupil filter is a phase pupil filter that functions to modulate phase distribution of the light directed through the POB 20.

The lithography system 10 also includes a substrate stage 255 to secure the wafer 250 to be patterned. In some embodiments, the semiconductor substrate is a semiconductor wafer, such as a silicon wafer or other type of wafer. The wafer 250 is coated with the resist layer sensitive to the radiation beam, such as EUV light in the present embodiment. Various components including those described above are integrated together and are operable to perform lithography exposing processes. The lithography system 10 may further include other modules or may be integrated with (or be coupled with) other modules.

The photomask 220 and the method making the same are further described in accordance with some embodiments. In some embodiments, the mask fabrication process includes two operations: a blank mask fabrication process and a mask patterning process. During the blank mask fabrication process, a blank mask is formed by deposing suitable layers (e.g., reflective multiple layers) on a suitable substrate. The blank mask is then patterned during the mask patterning process to achieve a desired design of a layer of an integrated circuit (IC). The patterned mask is then used to transfer circuit patterns (e.g., the design of a layer of an IC) onto a semiconductor wafer. The patterns can be transferred over and over onto multiple wafers through various lithography processes. A set of masks is used to construct a complete IC.

The photomask 220 includes a suitable structure, such as a binary intensity mask (BIM) and phase-shifting mask (PSM) in various embodiments. An example BIM includes absorptive regions (also referred to as opaque regions) and reflective regions, patterned to define an IC pattern to be transferred to the target. In the opaque regions, an absorber is present, and an incident light is almost fully absorbed by the absorber. In the reflective regions, the absorber is removed and the incident light is diffracted by a multilayer (ML). The PSM can be an attenuated PSM (AttPSM) or an alternating PSM (AltPSM). An exemplary PSM includes a first reflective layer (such as a reflective ML) and a second reflective layer patterned according to an IC pattern. In some examples, an AttPSM usually has a reflectivity of 2%-15% from its absorber, while an AltPSM usually has a reflectivity of larger than 50% from its absorber.

Figure 3:
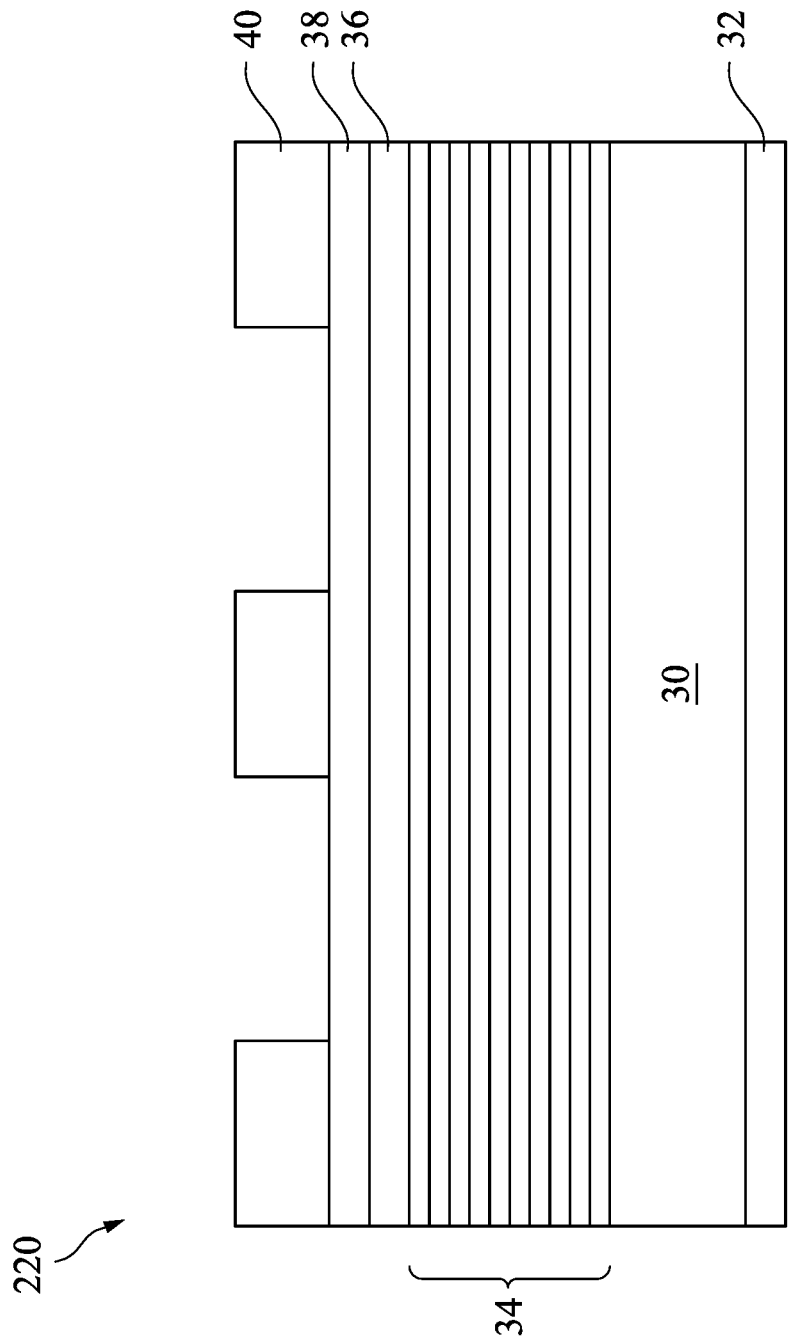
FIG. 3 is a photomask in accordance with some embodiments of the present disclosure.

One example of the photomask 220 is shown in FIG. 3. The photomask 220 in the illustrated embodiment is a EUV mask, and includes a substrate 30 made of a LTEM. The LTEM material may include $TiO_2$ doped $SiO_2$, and/or other low thermal expansion materials known in the art. In some embodiments, a conductive layer 32 is additionally disposed under on the backside of the LTEM substrate 30 for the electrostatic chucking purpose. In one example, the conductive layer 32 includes chromium nitride (CrN). In other embodiments, other suitable compositions are possible, such as a tantalum-containing material.

The photomask 220 includes a reflective multilayer structure 34 disposed over the LTEM substrate 30. The reflective multilayer structure 34 may be selected such that it provides a high reflectivity to a selected radiation type/wavelength. The reflective multilayer structure 34 includes a plurality of film pairs, such as Mo/Si film pairs (e.g., a layer of molybdenum above or below a layer of silicon in each film pair). Alternatively, the reflective multilayer structure 34 may include Mo/Be film pairs, or any materials with refractive index difference being highly reflective at EUV wavelengths.

Still referring to FIG. 3, the photomask 220 also includes a capping layer 36 disposed over the reflective multilayer structure 34 to prevent oxidation of the ML. In one embodiment, the capping layer 36 includes silicon with a thickness ranging from about 4 nm to about 7 nm. The photomask 220 may further include a buffer layer 38 disposed above the capping layer 36 to serve as an etching-stop layer in a patterning or repairing process of an absorption layer, which will be described later. The buffer layer 38 has different etching characteristics from the absorption layer disposed thereabove. The buffer layer 38 includes ruthenium (Ru), Ru compounds such as RuB, RuSi, chromium (Cr), chromium oxide, and chromium nitride in various examples.

The photomask 220 also includes an absorber layer 40 (also referred to as an absorption layer) formed over the buffer layer 38. In some embodiments, the absorber layer 40 absorbs the EUV radiation directed onto the mask. In various embodiments, the absorber layer may be made of tantalum boron nitride (TaBN), tantalum boron oxide (TaBO), or chromium (Cr), Radium (Ra), or a suitable oxide or nitride (or alloy) of one or more of the following materials: Actium, Radium, Tellurium, Zinc, Copper, and Aluminum.

Figure 4:
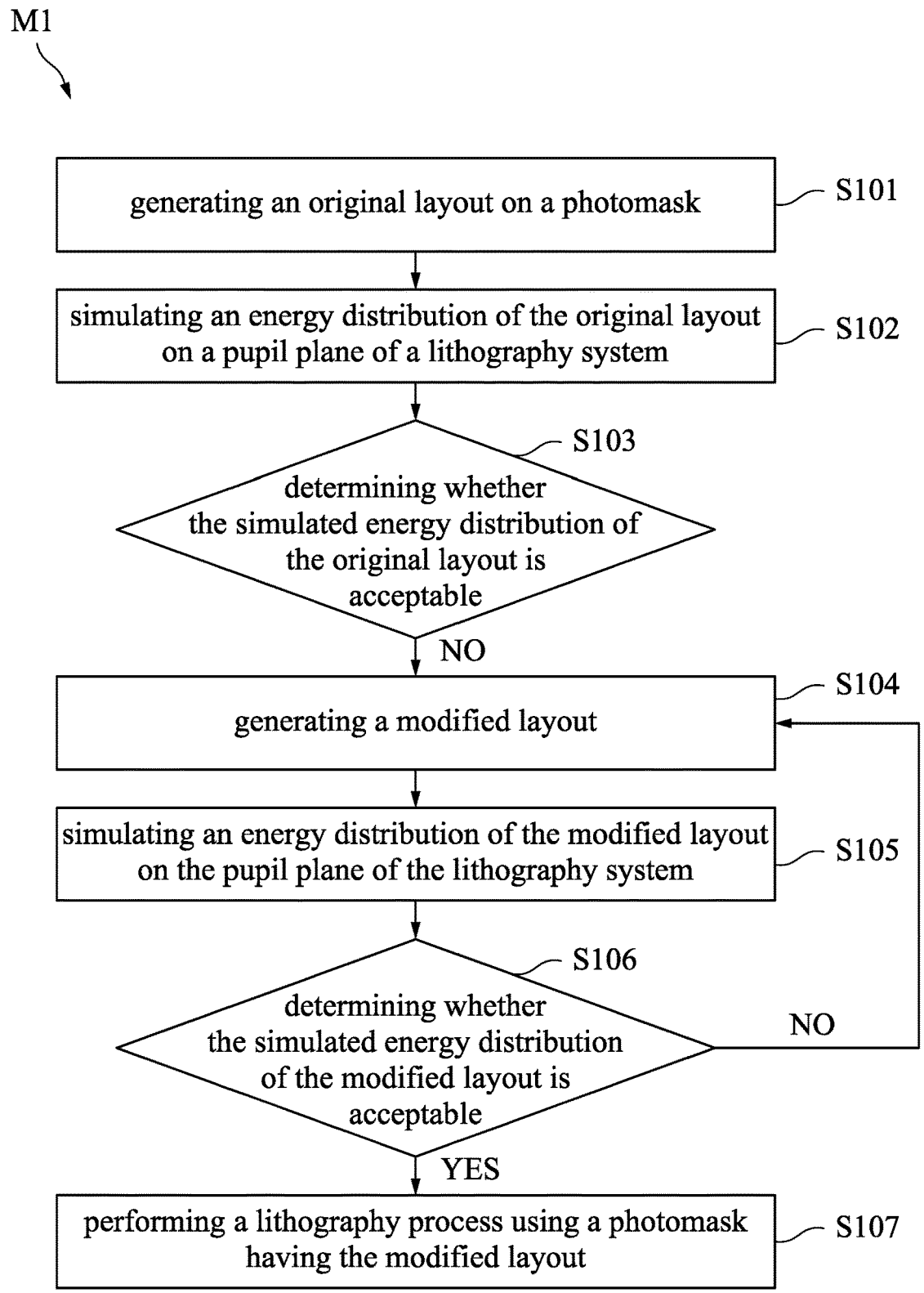
FIG. 4 illustrates a method of forming a layout of a photomask in accordance with some embodiments of the present disclosure.

FIG. 4 illustrates a method M1 of forming a layout of a photomask in accordance with some embodiments of the present disclosure. Although the method 1000 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

Figure 5:
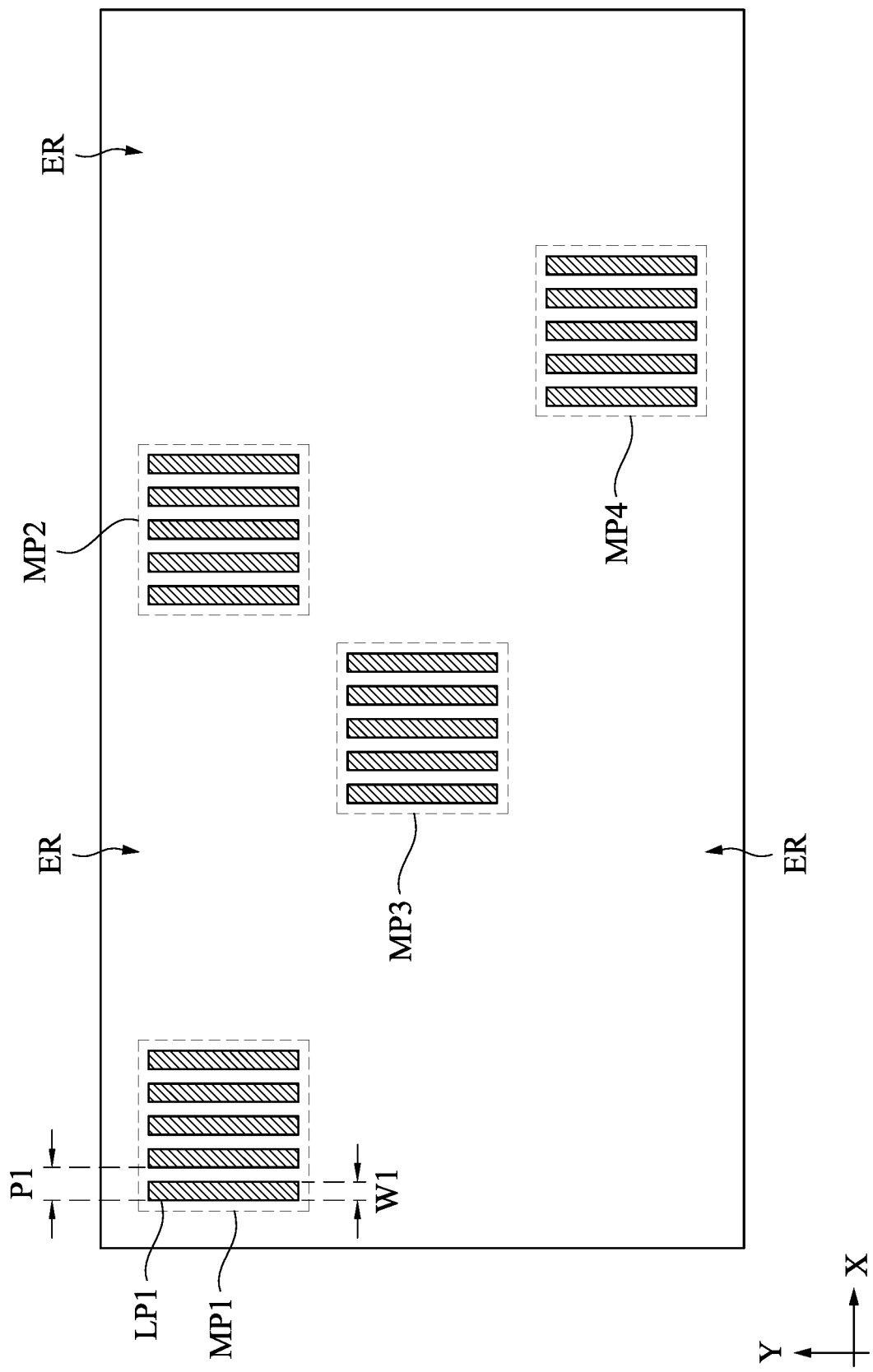
FIG. 5 illustrates a layout according to an embodiment of the present disclosure.

Reference is made to FIGS. 4 and 5. The method M1 starts at operation S101 by generating an original layout on a photomask. FIG. 5 illustrates an original layout 300 according to an embodiment of the present disclosure. The original layout 300 includes main pattern, in which the main pattern includes main pattern sets MP1, MP2, MP3 and MP4. Each of the main pattern sets MP1, MP2, MP3 and MP4 may include line patterns LP1. As an example of main pattern set MP1, each of the line patterns LP1 may extend along a first direction (e.g., Y direction). In some embodiments, the line patterns LP1 are for a gate electrode pattern in some embodiments, and are for a metal wiring pattern in other embodiments. In some embodiments, the line patterns LP1 are positioned with a pitch P1, and each of the line patterns LP1 has a line width W1, which may be defined by the design rule for the layer to be manufactured by a photomask. It is understood that the patterns LP1 may not be limited to "line patterns". In some other embodiments, the patterns LP1 may include contact hole patterns, or other suitable 2-D patterns.

In FIG. 5, the original layout 300 may include a plurality of empty regions ER. The empty regions ER may be referred to as the regions on the original layout 300 that are not occupied by the line patterns LP1 of the main pattern sets MP1, MP2, MP3 and MP4.

Referring back to FIG. 4, the method M1 proceeds to operation S102 by simulating an energy distribution of the original layout on a pupil plane of a lithography system. In some embodiments, the original layout 300 of FIG. 5 may be used in a photomask (e.g., the photomask MA of FIG. 1 or the photomask 220 of FIG. 2) of a lithography system (e.g., the lithography system 90 of FIG. 1 or the lithography system 10 of FIG. 2). In some embodiments, prior to manufacturing the photomask, an energy distribution (or phase distribution) of the original layout 300 on the pupil plane of the lithography may be simulated (or calculated). In some embodiments where the lithography system is a DUV lithography system (e.g., the DUV lithography system 90 of FIG. 1), the energy distribution on the pupil plane can be calculated based on thin mask approximation. In greater details, the simulated energy distribution can be obtained by performing a Fourier Transform to the patterns of the original layout 300. Stated another way, the simulated energy distribution of the original layout 300 on the pupil plane is a Fourier Transform of the patterns of the original layout 300. In some embodiments, the simulated energy distribution on the pupil plane can also be referred to as a light distribution on the pupil plane.

As an example of FIG. 5, the mathematic expression of each of the main pattern sets MP1 to MP4 of the original layout 300 can be expressed as followed:

$$f(x) = rect\left(\frac{x}{2w_x}\right) \otimes \left[\frac{1}{p_x}\text{comb}\left(\frac{x}{p_x}\right)\right]$$

in which $w_x$ may be the line width W1 of the line patterns LP1 of the main pattern sets MP1 to MP4, and $p_x$ may be the pitch P1 of the line patterns LP1 of the main pattern sets MP1 to MP4.

As mentioned above, the simulated energy distribution of the original layout 300 can be calculated by performing a Fourier Transform to the patterns of the original layout 300. For example, the mathematic expression of the energy distribution of the main pattern sets MP1 to MP4 of the original layout 300 can be expressed as followed:

$$g(f_x) = \frac{w_x}{p_x}\text{sinc}(w_x f_x)\,\text{comb}(p_x x).$$

As mentioned above, this equation is calculated based on thin mask approximation, which results in that the energy distribution of the original layout 300 on the pupil plane can be expressed as a function of pitch and width of the patterns of the original layout 300.

In some embodiments where the lithography system is an EUV lithography system (e.g., the EUV lithography system 10 of FIG. 2), because the scale of wavelength and the thickness of the photomask (e.g., the photomask 220 of FIG. 2) are at the same order, to obtain a more precise simulation result, the simulated energy distribution can be obtained by, for example, calculating a near field light distribution of EUV at the photomask by applying a Maxwell equation to the patterns of the original layout 300, and then performing a Fourier Transform to the near field light distribution of EUV at the photomask to obtain the energy distribution of the original layout 300 on the pupil plane.

Referring back to FIG. 4, the method M1 proceeds to operation S103 by determining whether the simulated energy distribution of the original layout is acceptable. For example, as shown in FIG. 5, the original layout 300 may include a large area of empty regions ER, and thus the calculated energy distribution may be inhomogeneous on the pupil plane of the lithography system. If the simulated energy distribution is inhomogeneous on the pupil plane, it indicates that the mirrors or lens in the projection system (e.g., projection system 860 of FIG. 1 or POB 20 of FIG. 2) may be heated inhomogeneously, which will result in local deformation on the mirrors or lens, and will induce refractive index variation. The local deformation and the refractive index variation may induce aberration, and will further impact critical dimension (CD) or Edge Placement Error (EPE) on a wafer. In some embodiments, one way to determine whether the simulated energy distribution of the original layout is acceptable includes, for example, simulating image contrast, CD uniformity, and/or process window by using the simulated energy distribution of the original layout under every exposure condition (including defocus, dose, mask bias . . . ), and determine whether the simulated image contrast, CD uniformity, and/or process window satisfy a predetermined specification. If the simulated image contrast, CD uniformity, and/or process window satisfy a predetermined specification, the simulated energy distribution can be regarded as acceptable. On the other hand, if the simulated image contrast, CD uniformity, and/or process window do not satisfy a predetermined specification, the simulated energy distribution can be regarded as unacceptable.

In some other embodiments, another way to determine whether the simulated energy distribution of the original layout is acceptable includes, for example, if the simulated energy distribution of the original layout is inhomogeneous (with aberration), the simulated energy distribution can be regarded as unacceptable. Stated another way, the unacceptable simulated energy distribution may include inhomogeneous wavefront. On the other hand, if the simulated energy distribution of the original layout is homogeneous enough (no aberration), the simulated energy distribution can be regarded as acceptable. Stated another way, the acceptable simulated energy distribution may include homogeneous wavefront. In some other embodiments, if the simulated energy distribution of the original layout is within or lower than a pre-determined threshold, the simulated energy distribution can be regarded as acceptable.

Reference is made to FIGS. 4, and 6A to 6G. If the energy distribution on the pupil plane is unacceptable, the method M1 then proceeds to operation S104 by generating a modified layout.

Figure 6A:
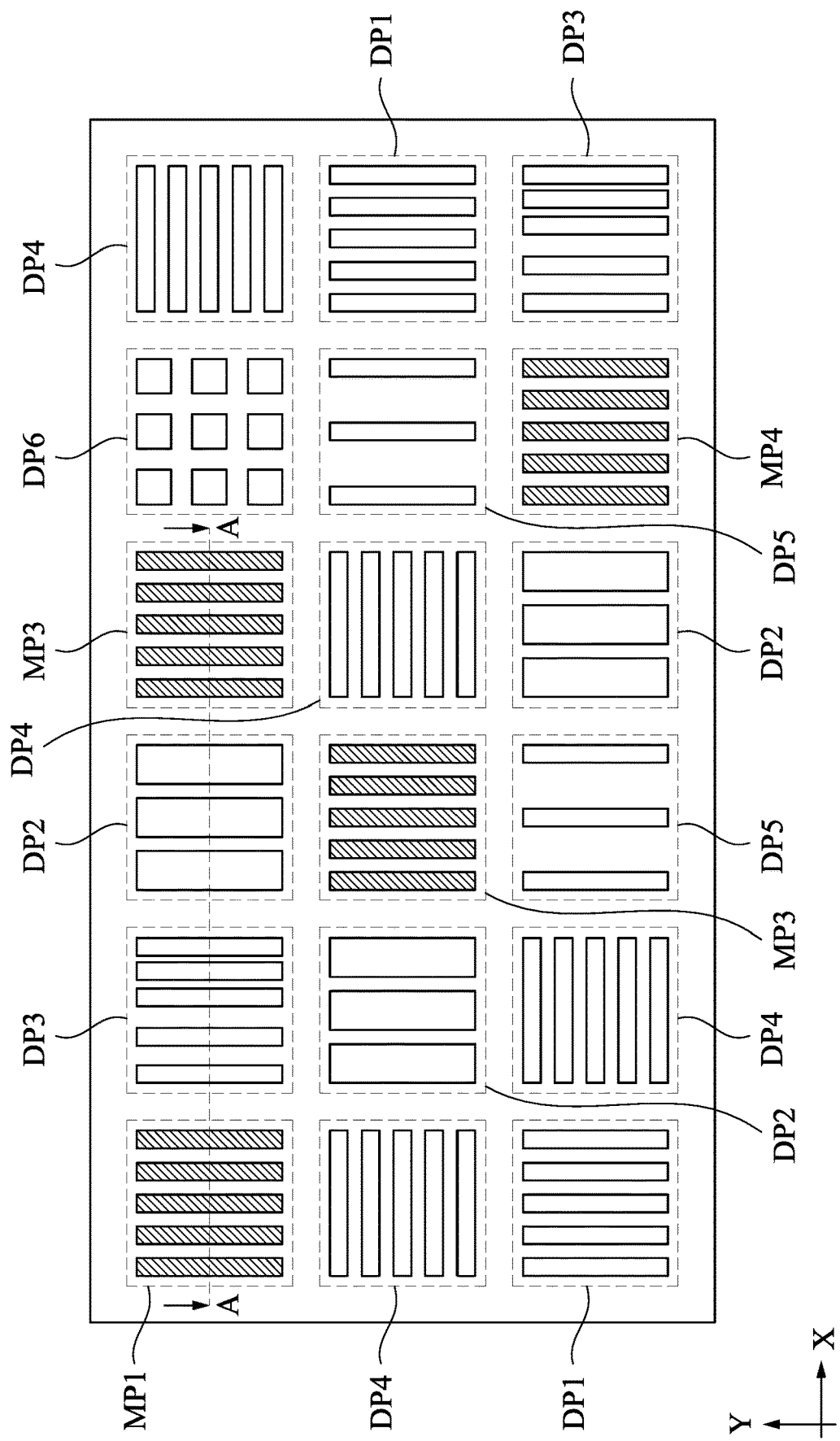
FIGS. 6A to 6G illustrate layouts according to an embodiment of the present disclosure.

FIG. 6A illustrates a modified layout 400 in accordance with some embodiments of the present disclosure. The empty regions ER of the original layout 300 (see FIG. 5) are inserted with dummy patterns, and thus a modified layout 400 is generated. Stated another way, the modified layout 400 is generated by inserting dummy patterns in empty regions of the original layout 300. In some embodiments, the dummy pattern includes a plurality of dummy pattern sets. FIGS. 6B to 6G illustrate layouts of different dummy pattern sets in accordance with some embodiments of the present disclosure.

In some embodiments, one purpose of generating a modified layout is to obtain a homogeneous energy distribution (heating-induced wavefront) on the pupil plane, such that the heating effect would not induce aberration. In some other embodiments, another purpose of generating a modified layout is to obtain a specific energy distribution (specific heating-induced wavefront) that can fulfill the process requirement. In one example, the modified layout may generate a specific energy distribution (specific heating-induced wavefront), which can offset the scanner intrinsic aberration, so as to obtain a less aberration. In another example, the modified layout may generate a specific energy distribution, which will result in a specific aberration distribution, if the modified layout can improve the image contrast, CD uniformity, and/or process window, the specific energy distribution (specific heating-induced wavefront) may be employed in the process.

Figures 6B, 6C, 6D:
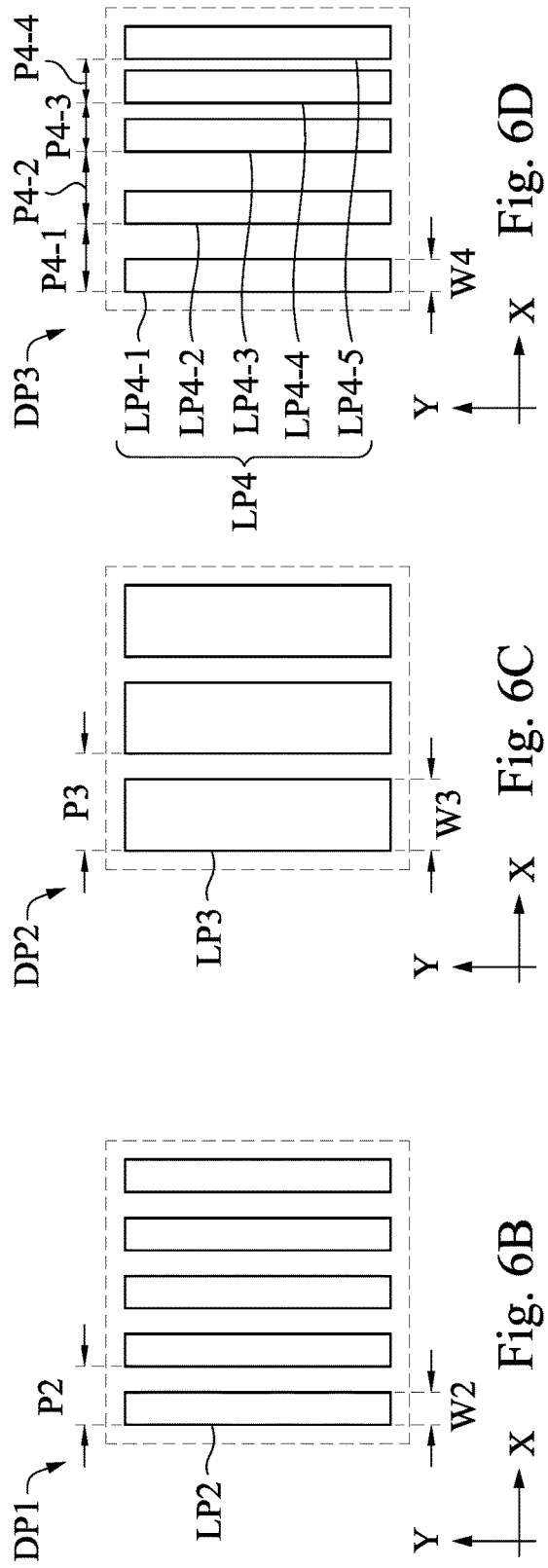

In FIG. 6B, shown there is a dummy pattern set DP1, the dummy pattern set DP1 includes line patterns LP2. The line pattern LP2 may extend along the first direction (e.g., Y direction) and are arranged along the second direction (e.g., X direction). The line patterns LP2 of the dummy pattern set DP1 may include line pitch P2 and a line width W2.

In FIG. 6C, shown there is a dummy pattern set DP2, the dummy pattern set DP2 includes line patterns LP3. The line pattern LP3 may extend along the first direction (e.g., Y direction) and are arranged along the second direction (e.g., X direction). The line patterns LP3 of the dummy pattern set DP2 may include line pitch P3 and a line width W3. In some embodiments, the line width W3 of the dummy pattern set DP2 is greater than the line width W2 of the dummy pattern set DP1 of FIG. 6B, and the line pitch P3 of the dummy pattern set DP2 is greater than the line pitch P2 of the dummy pattern set DP1 of FIG. 6B.

In FIG. 6D, shown there is a dummy pattern set DP3, the dummy pattern set DP3 includes line patterns LP4. The line patterns LP4 may extend along the first direction (e.g., Y direction). The line patterns LP4 of the dummy pattern set DP3 may include a line width W4. In some embodiments, the line width W4 of the dummy pattern set DP3 is substantially the same as the line width W2 of the dummy pattern set DP1 of FIG. 6B. In some embodiments, the line patterns LP4 do not include fixed pitch. For example, as shown in FIG. 6D, the line patterns LP4 may include line pattern LP4-1, LP4-2, LP4-3, LP4-4, and LP4-5, in which the line patterns LP4-1 and LP4-2 are spaced by a line pitch P4-1, the line patterns LP4-2 and LP4-3 are spaced by a line pitch P4-2 narrower than the line pitch P4-1, the line patterns LP4-3 and LP4-4 are spaced by a line pitch P4-3 narrower than the line pitch P4-2, and the line patterns LP4-4 and LP4-5 are spaced by a line pitch P4-4 narrower than the line pitch P4-3.

Figures 6E, 6F, 6G:
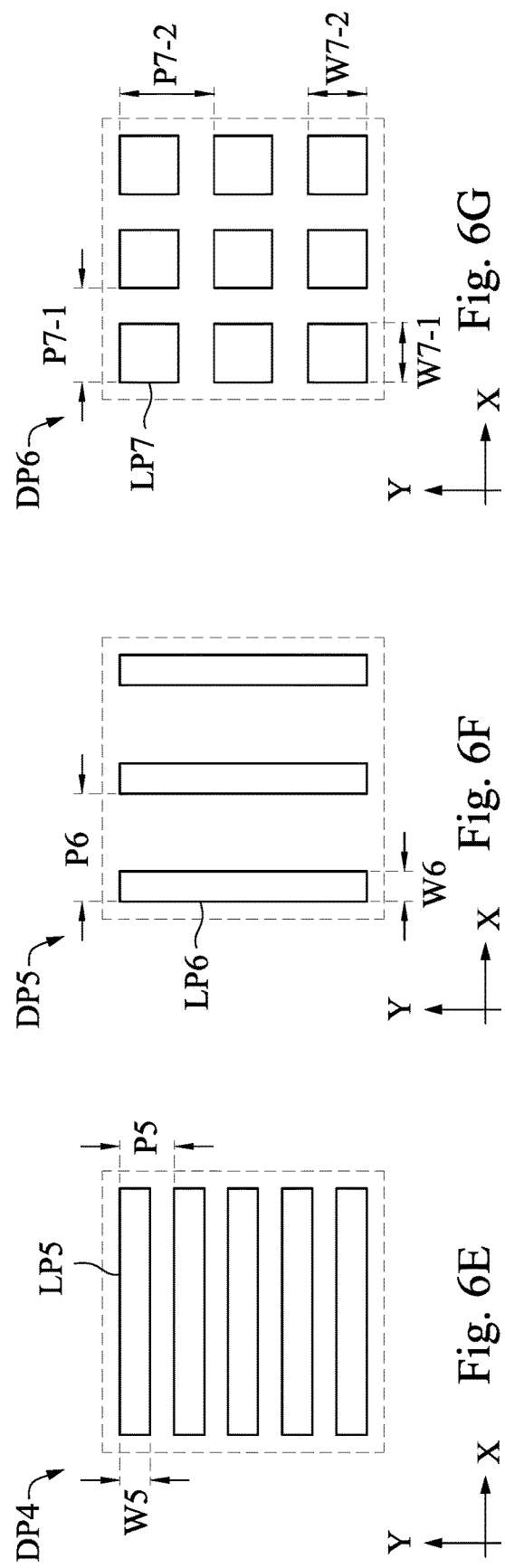

In FIG. 6E, shown there is a dummy pattern set DP4, the dummy pattern set DP4 includes line patterns LP5. The line patterns LP5 may extend along the second direction (e.g., X direction) vertical to the first direction (e.g., Y direction), and are arranged along the first direction (e.g., Y direction). The line patterns LP5 of the dummy pattern set DP4 may include a line pitch P5 and a line width W5. In some embodiments, the line pitch P5 and the line width W5 of the dummy pattern set DP4 are substantially the same as the line pitch P2 and the line width W2 of the dummy pattern set DP1 of FIG. 6B, respectively. In some embodiments, the dummy pattern set DP4 can be regarded as dummy pattern set DP1 of FIG. 6B rotating 90 degrees.

In FIG. 6F, shown there is a dummy pattern set DP5, the dummy pattern set DP5 includes line patterns LP6. The line patterns LP6 may extend along the first direction (e.g., Y direction). The line patterns LP6 of the dummy pattern set DP5 may include a line pitch P6 and a line width W6. In some embodiments, the line pitch P6 is greater than the line pitch P2 of the dummy pattern set DP1 of FIG. 6B, and the line width W6 is substantially the same as the line width W2 of the dummy pattern set DP1 of FIG. 6B.

In FIG. 6G, shown there is a dummy pattern set DP6, the dummy pattern set DP6 includes block patterns LP7. In some embodiments, each of the block patterns LP7 may include a width W7-1 and a height W7-2. Here, the height W7-2 can also be referred to as the width of the block pattern LP8 along the first direction (e.g., Y direction). In some embodiments, the width W7-1 and the height W7-2 of each block pattern LP8 are substantially the same, and thus the block pattern LP8 may also be referred to as square patterns. In some embodiments, the block patterns LP8 are arranged in matrix, in which the block patterns LP8 are spaced by a pitch P7-1 along the second direction (e.g., X direction), and are spaced by a pitch P7-2 along the first direction (e.g., Y direction).

Referring back to FIG. 6A, the modified layout 400 includes the main pattern sets MP1, MP2, MP3, and MP4 as described in FIG. 5. The modified layout 400 may also include at least one dummy pattern. In the example of FIG. 6A, the modified layout 400 includes 14 dummy pattern sets. In greater details, the modified layout 400 includes 3 dummy pattern sets DP1 of FIG. 6B, 3 dummy pattern sets DP2 of FIG. 6C, 2 dummy pattern sets DP3 of FIG. 6D, 4 dummy pattern sets DP4 of FIG. 6E, 2 dummy pattern sets DP5 of FIG. 6F, and 1 dummy pattern sets DP6 of FIG. 6G. The percentages of the dummy pattern sets DP1, DP2, DP3, DP4, DP5, and DP6 are $X_1\%$, $X_2\%$, $X_3\%$, $X_4\%$, $X_5\%$, and $X_6\%$. In the embodiments of FIG. 6A, $X_1\%$, $X_2\%$, $X_3\%$, $X_4\%$, $X_5\%$, and $X_6\%$ are about 21.4%, 21.4%, 14.3%, 28.6%, 14.3%, and 7.1%, respectively. It is noted that, the numbers and the arrangement of the dummy pattern sets DP1, DP2, DP3, DP4, DP5, and DP6 in the modified layout 400 are merely used to explain. Based on the design rule of manufacturing a layout, on skilled in the art can adjust the numbers and the arrangement of the dummy pattern sets in the modified layout 400 to obtain a desired energy distribution on the pupil plane.

Referring back to FIG. 4, the method M1 proceeds to operation S105 by simulating an energy distribution of the modified layout on the pupil plane of the lithography system. In some embodiments, the modified layout 400 of FIG. 6A may be used in a photomask (e.g., the photomask of FIG. 1 or the photomask 220 of FIG. 2) of a lithography system (e.g., the lithography system 90 of FIG. 1 or the lithography system 10 of FIG. 2). In some embodiments, prior to manufacturing the photomask, an energy distribution (or phase distribution) of the modified layout 400 on the pupil plane of the lithography may be simulated. In some embodiments where the lithography system is a DUV lithography system (e.g., the DUV lithography system 90 of FIG. 1), the energy distribution on the pupil plane can be calculated based on thin mask approximation. In greater details, the simulated energy distribution can be obtained by performing a Fourier Transform to the patterns of the modified layout 400. Stated another way, the simulated energy distribution of the modified layout 400 on the pupil plane is a Fourier Transform of the patterns of the modified layout 400.

As an example of FIGS. 6A, 6B, 6C, and 6F, the mathematic expression of the main pattern sets MP1 to MP4 and the dummy pattern sets DP1, DP2, DP5 of the modified layout 400 can be expressed as followed:

$$f(x) = rect\left(\frac{x}{2w_x}\right) \otimes \left[\frac{1}{p_x}\text{comb}\left(\frac{x}{p_x}\right)\right]$$

in which $w_x$ may be the line width W1 of the main pattern sets MP1 to MP4, the line width W2 of the dummy pattern set DP1, the line width W3 of the dummy pattern set DP2, and the line width W6 of the dummy pattern set DP5. Furthermore, $p_x$ may be the pitch P1 of the main pattern sets MP1 to MP4, the pitch P2 of the dummy pattern set DP1, the pitch P3 of the dummy pattern set DP2, and the pitch P6 of the dummy pattern set DP5.

The simulated energy distribution of the modified layout 400 can be calculated by performing a Fourier Transform to the patterns of the modified layout 400. For example, the mathematic expression of the energy distribution of the main pattern sets MP1 to MP4 and the dummy pattern sets DP1, DP2, DP5 of the modified layout 400 can be expressed as followed:

$$g(f_x) = \frac{w_x}{p_x}\text{sinc}(w_x f_x)\ \text{comb}(p_x x).$$

As mentioned above, this equation is calculated based on thin mask approximation, which results in that the energy distribution of the modified layout 400 on the pupil plane can be expressed as a function of pitch and width of the patterns of the modified layout 400.

In some embodiments where the lithography system is an EUV lithography system (e.g., the EUV lithography system 10 of FIG. 2), because the scale of wavelength and the thickness of the photomask (e.g., the photomask 220 of FIG. 2) are at the same order, to obtain a more precise simulation result, the simulated energy distribution can be obtained by, for example, calculating a near field light distribution of EUV at the photomask by applying a Maxwell equation to the patterns of the original layout 300, and then performing a Fourier Transform to the near field light distribution of EUV at the photomask to obtain the energy distribution of the modified layout 400 on the pupil plane.

Moreover, as an example of FIG. 6G, the mathematic expression of the dummy pattern sets DP6 of the modified layout 400 can be expressed as followed:

$$f(x, y) = \left[\text{rect}\left(\frac{x}{2w_x}\right)\text{rect}\left(\frac{y}{2w_y}\right)\right] \otimes \left[\frac{1}{p_x p_y}\text{comb}\left(\frac{x}{p_x}\right)\text{comb}\left(\frac{y}{p_y}\right)\right]$$

in which $w_x$ may be the width W7-1 of the dummy pattern set DP6, $w_y$ may be the height W7-2 of the dummy pattern set DP6, $p_x$ may be the pitch P7-1 of the dummy pattern set DP6, and $p_y$ may be the pitch P7-2 of the dummy pattern set DP6.

The simulated energy distribution of the modified layout 400 can be calculated by performing a Fourier Transform to the patterns of the modified layout 400. For example, the mathematic expression of the energy distribution of the dummy pattern set DP6 of the modified layout 400 can be expressed as followed:

$$g(f_x, f_y) = \delta(f_x, f_y) - \frac{w_x w_y}{p_x p_y}\text{sinc}(w_x f_x)\ \text{sinc}(w_y f_y)\ \text{comb}(p_x x)\text{comb}(p_y y).$$

As mentioned above, this equation is calculated based on thin mask approximation, which results in that the energy distribution of the modified layout 400 on the pupil plane can be expressed as a function of pitch and width of the patterns of the modified layout 400.

In some embodiments where the lithography system is an EUV lithography system (e.g., the EUV lithography system 10 of FIG. 2), because the scale of wavelength and the thickness of the photomask (e.g., the photomask 220 of FIG. 2) are at the same order, to obtain a more precise simulation result, the simulated energy distribution can be obtained by, for example, calculating a near field light distribution of EUV at the photomask by applying a Maxwell equation to the patterns of the original layout 300, and then performing a Fourier Transform to the near field light distribution of EUV at the photomask to obtain the energy distribution of the modified layout 400 on the pupil plane.

Referring back to FIG. 4, the method M1 proceeds to operation S106 by determining whether the simulated energy distribution of the modified layout is acceptable. In some embodiments wherein the modified layout is designed to have a specific energy distribution, one way to determine whether the simulated energy distribution of the modified layout is acceptable includes, for example, simulating image contrast, CD uniformity, and/or process window by using the simulated energy distribution of the modified layout under every exposure condition (including defocus, dose, mask bias . . . ), and determine whether the simulated image contrast, CD uniformity, and/or process window satisfy a predetermined specification. If the simulated image contrast, CD uniformity, and/or process window satisfy a predetermined specification, the simulated energy distribution can be regarded as acceptable. On the other hand, if the simulated image contrast, CD uniformity, and/or process window do not satisfy a predetermined specification, the simulated energy distribution can be regarded as unacceptable.

In some other embodiments, another way to determine whether the simulated energy distribution of the modified layout is acceptable includes, for example, if the simulated energy distribution (or the wavefront of the simulated energy distribution) of the modified layout 400 is inhomogeneous (with aberration), the simulated energy distribution can be regarded as unacceptable. Stated another way, the unacceptable simulated energy distribution may include inhomogeneous wavefront. On the other hand, if the simulated energy distribution (or the wavefront of the simulated energy distribution) of the modified layout 400 is homogeneous enough, the simulated energy distribution can be regarded as acceptable. In some other embodiments, if the simulated energy distribution (or wavefront) of the modified layout is more homogeneous than the simulated energy distribution (or wavefront) of the original layout 300, the simulated energy distribution of the modified layout 400 can be regarded as unacceptable. Stated another way, the acceptable simulated energy distribution may include homogeneous wavefront. In some other embodiments, if the simulated energy distribution of the modified layout is within or lower than a pre-determined threshold, the simulated energy distribution can be regarded as acceptable.

Reference is made to FIGS. 4 and 7A to 7D. If the calculated energy distribution of the modified layout is acceptable, the method M1 proceeds to operation S107 by performing a lithography process using a photomask having the first modified layout.

FIGS. 7A to 7D show various stages of a sequential manufacturing operation of a semiconductor device according to an embodiment of the present disclosure. It is understood that additional operations can be provided before, during, and after the processes shown by FIGS. 7A to 7D, and some of the operations described below can be replaced or eliminated, for additional embodiments of the method. Material, configuration, dimensions and/or processes the same as or similar to the foregoing embodiments described with FIGS. 7A to 7D may be employed in the following embodiments, and detailed explanation thereof may be omitted.

Figure 7A:
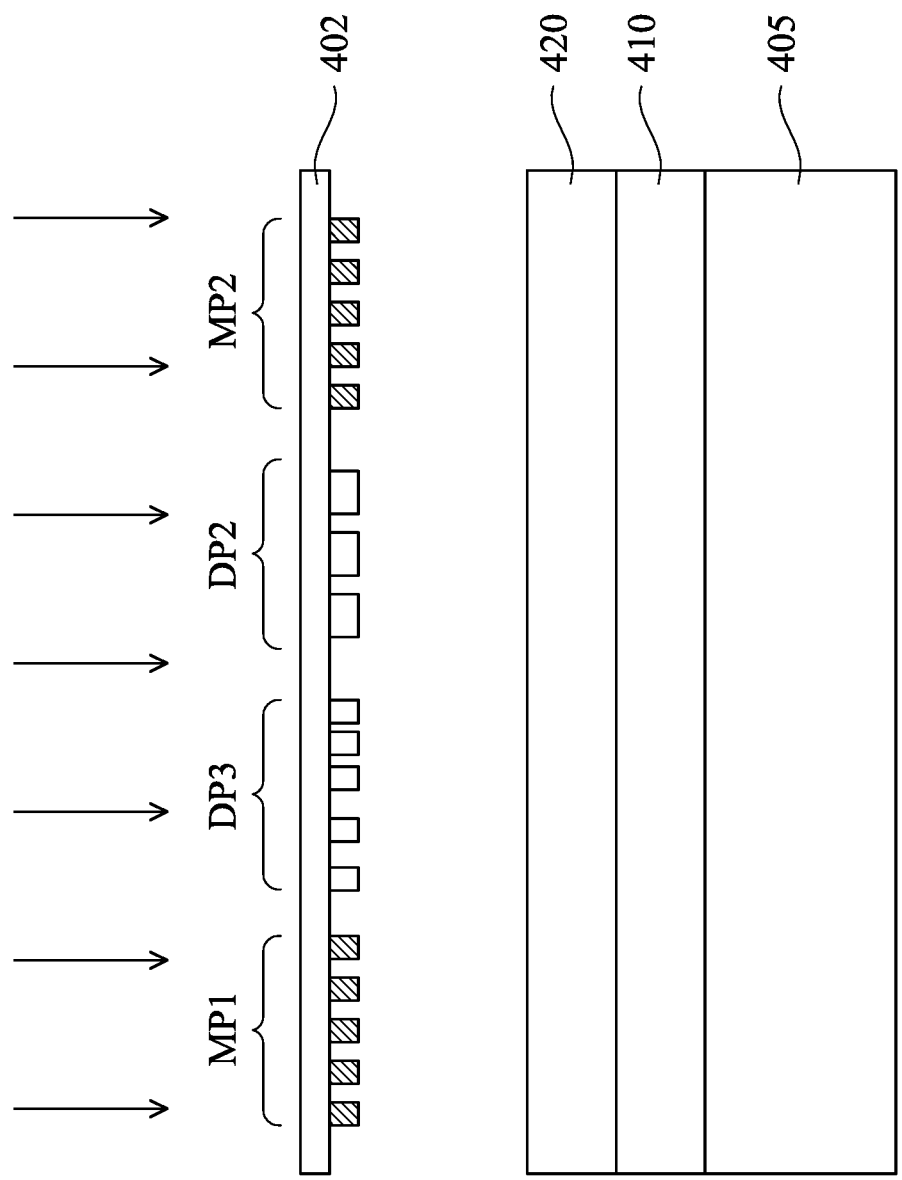
FIGS. 7A to 7D show various stages of a sequential manufacturing operation of a semiconductor device according to an embodiment of the present disclosure.

As shown in FIG. 7A, a conductive layer 410 is formed over a substrate 405. In some embodiments, the substrate 405 may be similar to the wafer W described in FIG. 1 or wafer 250 described in FIG. 2. In some embodiments, the substrate 405 includes a suitable elemental semiconductor, such as silicon, diamond or germanium; a suitable alloy or compound semiconductor, such as Group-IV compound semiconductors (silicon germanium (SiGe), silicon carbide (SiC), silicon germanium carbide (SiGeC), GeSn, SiSn, SiGeSn), Group III-V compound semiconductors (e.g., gallium arsenide (GaAs), indium gallium arsenide (InGaAs), indium arsenide (InAs), indium phosphide (InP), indium antimonide (InSb), gallium arsenic phosphide (GaAsP), or gallium indium phosphide (GaInP)), or the like. Further, the substrate 405 may include an epitaxial layer (epi-layer), which may be strained for performance enhancement, and/or may include a silicon-on-insulator (SOI) structure.

The conductive layer 410 includes semiconductor material such as silicon, SiGe or Ge or metallic material, such as Cu, AlCu, W, Co, Ni, Ti, TiN, Ta or TaN, or metal alloys, such as silicide. The semiconductor material can be single crystalline epitaxially formed, poly crystalline or amorphous. The conductive layer 410 can be formed by physical vapor deposition (PVD), molecular beam epitaxy (MBE), pulsed laser deposition (PLD), atomic layer deposition (ALD), electron beam (e-beam) epitaxy, chemical vapor deposition (CVD), or derivative CVD processes, including low pressure CVD (LPCVD), ultrahigh vacuum CVD (UHVCVD), reduced pressure CVD (RPCVD), electro plating, or any combinations thereof, or any other suitable film deposition method.

Further, a photoresist layer 420 is formed over the conductive layer 410. In some embodiments, the photoresist layer 420 made be made of a positive tone photo resist. In some embodiments, a hard mask layer (not shown) including one or more dielectric or metallic layers may be formed on the conductive layer 410 and the photoresist layer 420 is formed on the hard mask layer.

A photomask 402 is manufactured to have the modified layout 400 as described in FIG. 6A. By using the photomask 402 with the modified layout 400, the photoresist layer 420 is exposed with exposure light. The cross-sectional view of the original layout 400 on the photomask 402 in FIG. 6A is taken along line A-A of the modified layout 400 in FIG. 6A. For example, FIG. 6A illustrates the main pattern sets MP1, MP2, and dummy pattern sets DP2, DP3.

The pattern of the modified layout 400 is imaged on the photoresist layer 420. For example, by using the lithography system 90 of FIG. 1 or the lithography system 10 of FIG. 2. The radiation irradiates particular regions of the photoresist layer 420 based on the patterns of the modified layout 400 carried by the radiation, and thus the layer of irradiated photoresist layer can be patterned after developing it.

Figure 7B:
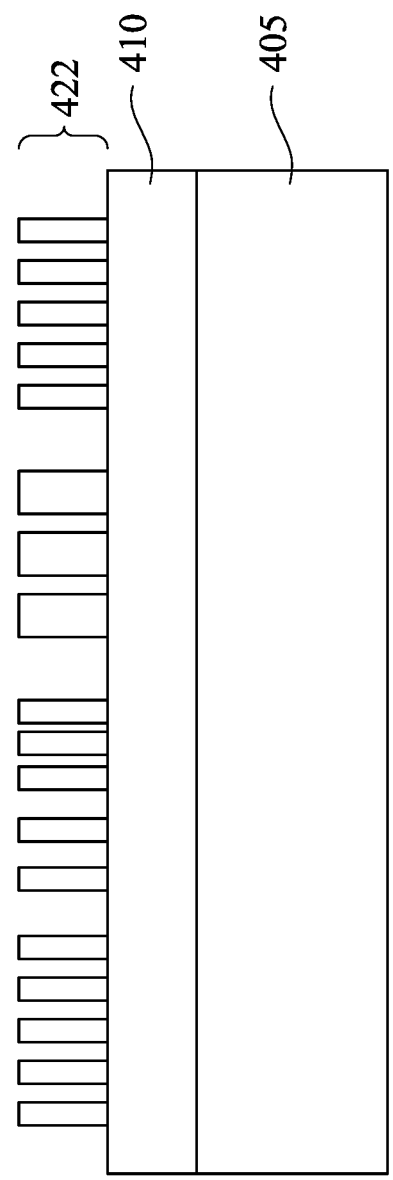

In FIG. 7B, after the exposed photoresist layer 420 is developed, a photo resist pattern 422 is then formed. In some embodiments, the pattern of the modified layout 400 is imaged on the photoresist layer 420.

Figure 7C:
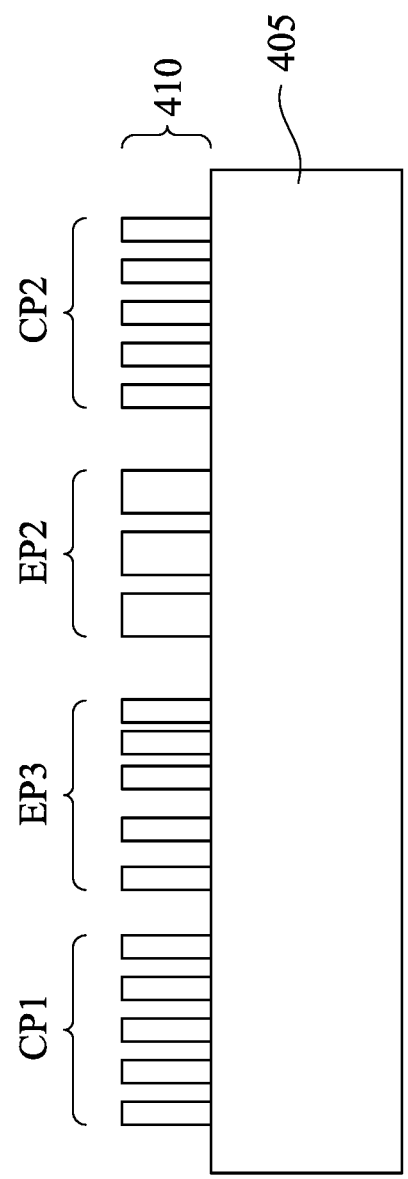

In FIG. 7C, the conductive layer 410 is patterned by one or more etching operations, by using the photo resist pattern 422 as an etching mask. When a hard mask layer (not shown) is used, the hard mask layer is patterned by using the photo resist pattern 422 as an etching mask, and the conductive layer 410 is patterned by using the patterned hard mask layer. In some embodiments, after the etching operations a CMP process may be optionally performed. In some embodiments, the patterned conductive layer 410 may serves as conductive wirings (e.g., metal lines) of back-end-of-line (BEOL), or may serves as gate structures.

In greater details, the patterned conductive layer 410 includes main pattern sets CP1 and CP2, in which the main pattern sets CP1 and CP2 of the patterned conductive layer 410 are substantially the same as (or correspond to) the main pattern sets MP1 and MP2 of the modified layout 400, respectively. The patterned conductive layer 410 further includes dummy pattern sets EP2 and EP3, in which the dummy pattern sets EP2 and EP3 of the patterned conductive layer 410 are substantially the same as (or correspond to) the dummy pattern sets DP2 and DP3 of the modified layout 400, respectively.

Furthermore, although not shown in FIG. 7C, the main pattern sets MP3, MP4, and dummy pattern sets DP1, DP4, DP5, and DP6 of FIG. 6A may also be imaged on the patterned conductive layer 410. That is, the patterned conductive layer 410 may also include patterns corresponding to the main pattern sets MP3, MP4, and dummy pattern sets DP1, DP4, DP5, and DP6 of FIG. 6A. In some embodiments, the main pattern sets CP1 and CP2 of the patterned conductive layer 410 are part of the functional circuitry.

In some embodiments, the dummy pattern sets (e.g., dummy pattern sets EP2 and EP3) are inserted in the patterned conductive layer 410 and may provide advantages. In some embodiments where the dummy pattern sets are omitted in the layout of the photomask, there may be several empty regions in the layout of the photomask. The empty regions may be transferred to the patterned conductive layer 410, and the patterned conductive layer 410 would have non-uniform pattern density. This will result in different etch rates at different regions over the substrate 405, and will deteriorate the reliability of the etching process. Accordingly, by inserting the dummy pattern sets in the photomask, the pattern density can be balanced, and the etch rates at different regions over the substrate 405 can be balanced. Accordingly, reliability of the etching process can be improved.

Figure 7D:
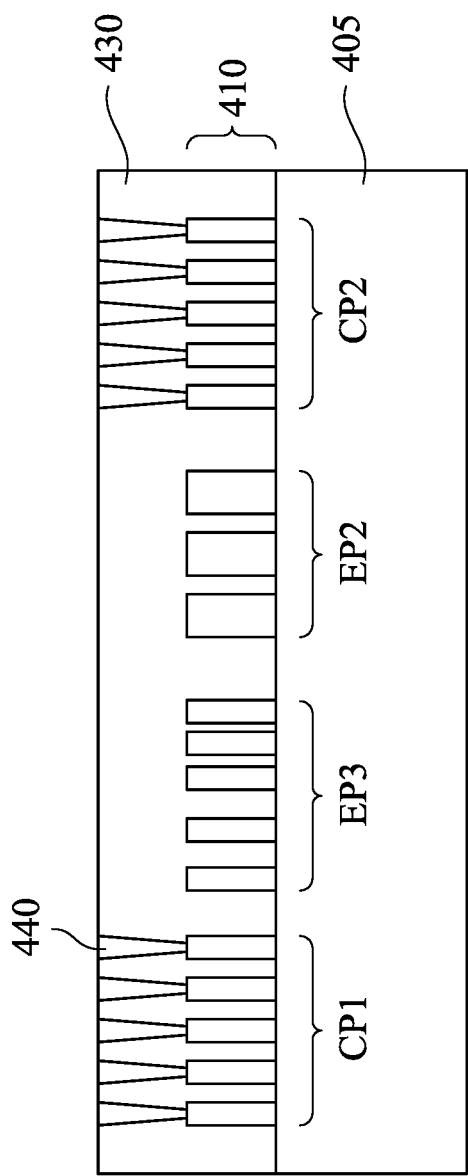

In FIG. 7D, one or more dielectric material layers 430 are formed over the patterned conductive layer 410. Further, one or more via plugs 440 are formed to contact the main pattern sets CP1 and CP2 of the patterned conductive layer 410, which are part of the functional circuitry. In contrast, no via plug is formed on the dummy pattern sets EP2 and EP3 of the patterned conductive layer 422, and thus the dummy pattern sets EP2 and EP3 of the patterned conductive layers 422 are electrically floating in some embodiments. That is, in the final structure, there may be no via or plug that is electrically connected to the dummy pattern sets EP2 and EP3 of the patterned conductive layers 422. For example, layers above or below the patterned conductive layers 422 may not include via or plug that are electrically connected to the dummy pattern sets of the patterned conductive layers 422. Stated another way, an entirety of surfaces of the dummy pattern sets of the conductive layers 422 is covered by an insulating material (e.g., a dielectric layer).

Figure 8:
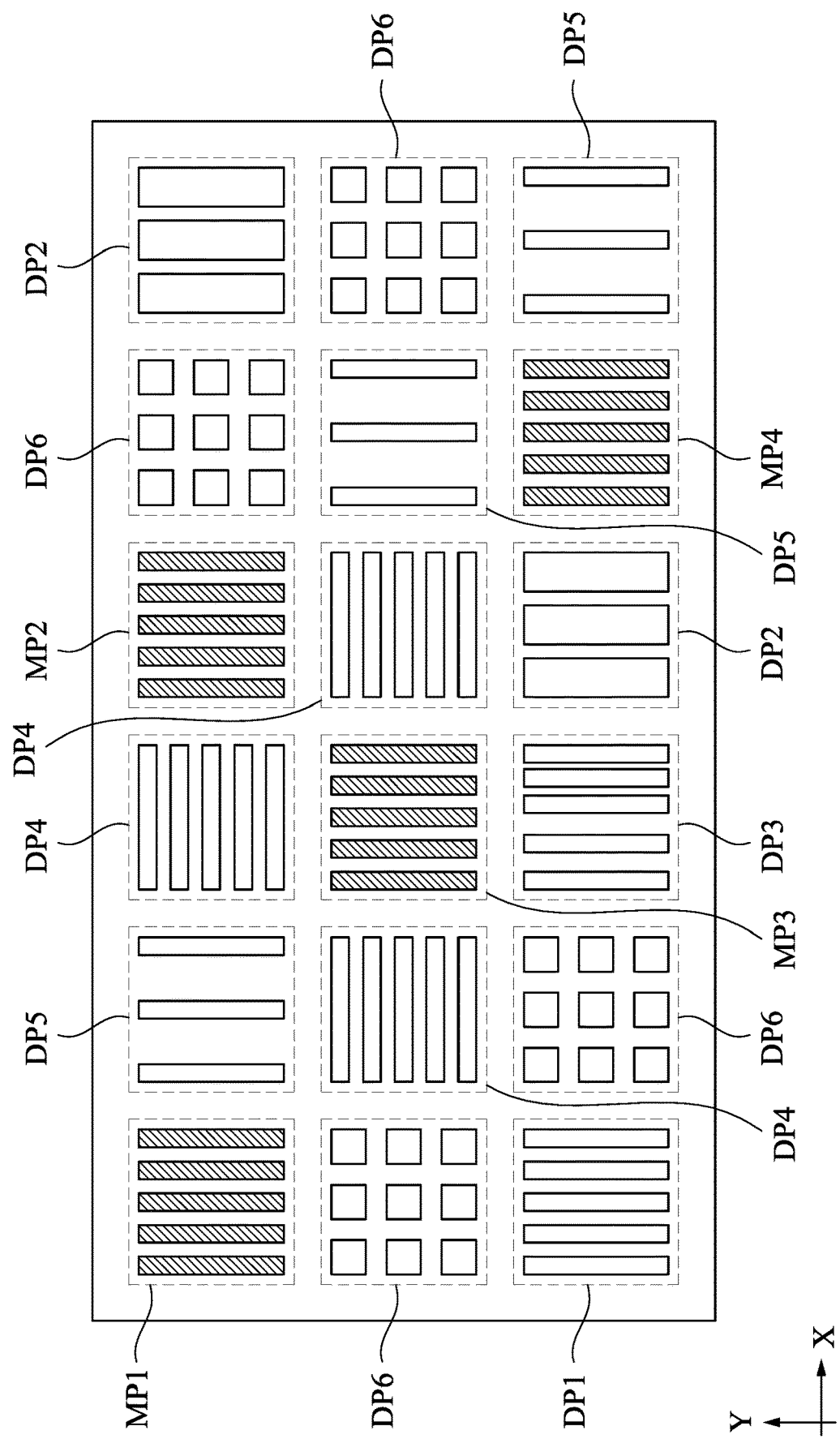
FIG. 8 illustrates a layout according to an embodiment of the present disclosure.

Reference is made to FIGS. 4 and 8. If the calculated energy distribution of the first modified layout is unacceptable, the method M1 returns to operation S104 by generating a modified layout.

FIG. 8 illustrates a modified layout 500 in accordance with some embodiments of the present disclosure. In FIG. 8, the modified layout 400 of FIG. 6A is modified into the modified layout 500. In some embodiments, the modified layout 400 of FIG. 6A may be modified by changing numbers of the dummy pattern sets or changing positions of the dummy pattern sets. However, the main pattern sets MP1 to MP4 in the modified layout 400 of FIG. 6A are not changed. That is, for example, the main pattern sets MP1, MP2, MP3, and MP4 in the modified layout 400 maintain their original positions as in the original layout 300 of FIG. 5.

In greater details, the modified layout 500 includes 14 dummy pattern sets. In greater details, the modified layout 500 includes 1 dummy pattern sets DP1 of FIG. 6B, 2 dummy pattern sets DP2 of FIG. 6C, 1 dummy pattern sets DP3 of FIG. 6D, 3 dummy pattern sets DP4 of FIG. 6E, 3 dummy pattern sets DP5 of FIG. 6F, and 4 dummy pattern sets DP6 of FIG. 6G. The percentages of the dummy pattern sets DP1, DP2, DP3, DP4, DP5, and DP6 in the modified layout 500 are $X_1\%$, $X_2\%$, $X_3\%$, $X_4\%$, $X_5\%$, and $X_6\%$. In the embodiments of FIG. 8, $X_1\%$, $X_2\%$, $X_3\%$, $X_4\%$, $X_5\%$, and $X_6\%$ are about 7.1%, 14.3%, 7.1%, 21.4%, 21.4%, and 28.6%, respectively.

Figure 9:
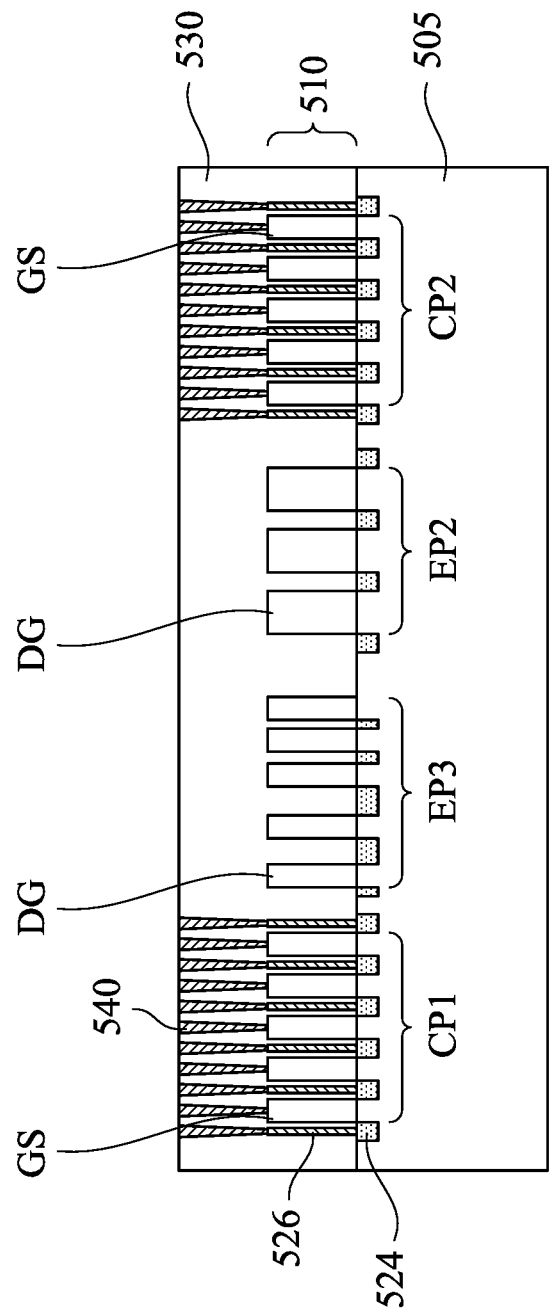
FIG. 9 illustrates a cross-sectional view of a semiconductor device according to an embodiment of the present disclosure.

FIG. 9 is a cross-sectional view of a semiconductor device in accordance with some embodiments of the present disclosure. Shown there is a substrate 505. In some embodiments, the substrate 505 includes a semiconductor substrate. The substrate 505 may include a crystalline silicon substrate or a doped semiconductor substrate (e.g., p-type semiconductor substrate or n-type semiconductor substrate). In some alternative embodiments, the substrate 505 includes a semiconductor substrate made of other suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide.

A gate layer 510 is formed over the substrate 505. For example, the gate layer 510 includes main gate patterns having main gate pattern sets CP1 and CP2, and dummy gate patterns having dummy gate pattern sets EP2 and EP3. In some embodiments, each of the main gate pattern sets CP1 and CP2 includes a plurality of gate structures GS, in which gate structures GS are part of the functional circuitry. That is, the gate structures GS may provide circuit function in a final structure of a semiconductor device. On the other hand, each of the dummy gate pattern sets EP2 and EP3 includes a plurality of dummy gate structures DG, in which the dummy gate structures DG are not a part of the functional circuitry. That is, the dummy gate structures DG do not provide circuit function in a final structure of a semiconductor device.

In some embodiments, the main gate pattern sets CP1 and CP2, and dummy gate pattern sets EP2 and EP3 may be formed by the method described in FIGS. 7A to 7C. For example, a gate material layer may be formed on the substrate 505, and the gate material layer is then patterned by using a photomask described in FIGS. 1 to 8. For example, the gate material layer is patterned by using a photomask having the layout of FIG. 6A, and the main gate pattern sets CP1 and CP2, and dummy gate pattern sets EP2 and EP3 have similar profile as the main pattern sets CP1 and CP2, and dummy pattern sets EP2 and EP3 described in FIG. 7C. It is noted that, the dummy gate pattern sets on the substrate 505 may also have the profiles as described in FIGS. 6B to 6G. That is, the dummy pattern sets DP1 to DP6 of FIGS. 6B to 6G may be transferred to the patterned gate material layer by using a photomask having the layouts of the dummy pattern sets DP1 to DP6 of FIGS. 6B to 6G.

Source/drain regions 524 may be formed as doped regions in the substrate 505 and on opposite sides of the gate structures GS and/or on opposite sides of the dummy gate structures DG. In some embodiments, the source/drain regions 524 may include Ge, Si, GaAs, AlGaAs, SiGe, GaAsP, SiP, or other suitable material, and may be doped with N-type dopants or P-type dopants. In some embodiments, the source/drain regions 524 may also be referred to as source/drain epitaxial structures. In some embodiments, each of the gate structures GS and the source/drain regions 524 on its opposite sides may form a transistor.

An interlayer dielectric (ILD) layer 530 may be formed over the substrate 505. In some embodiments, the ILD layer 530 may include silicon oxide, silicon nitride, silicon oxynitride, phosphosilicate glass (PSG), borophosphosilicate glass (BPSG), low-k dielectric material, and/or other suitable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. In some embodiments, the ILD layer 530 may be formed by suitable deposition process, such as CVD, PVD, ALD, or the like.

Source/drain contacts 526 are formed in the ILD layer 530 and are electrically connected to the source/drain regions 524. In some embodiments, the source/drain contacts 526 may include Ti, W, Co, Cu, Al, Mo, MoW, W, TiN, TaN, WN, combinations thereof, or other suitable conductive material.

In some embodiments, the source/drain contacts 526 are formed in contact with the source/drain regions 524 that are on opposite sides of the gate structures GS of the main gate pattern sets CP1 and CP2. On the other hand, because the dummy gate structures DS do not provide circuit function in the semiconductor device, the source/drain regions 524 are not formed in contact with the source/drain regions 524 that are on opposite sides of the dummy gate structures DG of the dummy gate pattern sets EP1 and EP2. Stated another way, the source/drain regions 524 on opposite sides of the dummy gate structures DG of the dummy gate pattern sets EP1 and EP2 are free from contacting the source/drain contacts 526, and are free from electrically connecting to other elements in the semiconductor device. That is, the source/drain regions 524 on opposite sides of the dummy gate structures DG of the dummy gate pattern sets EP1 and EP2 are electrically floating, and thus the source/drain regions 524 on opposite sides of the dummy gate structures DG of the dummy gate pattern sets EP1 and EP2 may also be referred to as dummy source/drain regions.

Via plugs 540 are formed in the ILD layer 530, and may be formed in contact with the gate structures GS of the main gate pattern sets CP1 and CP2, and in contact with the source/drain contacts 526. In some embodiments, the via plugs 540 may include Ti, W, Co, Cu, Al, Mo, MoW, W, TiN, TaN, WN, combinations thereof, or other suitable conductive material.

In some embodiments, because the dummy gate structures DS do not provide circuit function in the semiconductor device, the via plugs 540 are not formed in contact with the dummy gate structures DG of the dummy gate pattern sets EP1 and EP2. Stated another way, the dummy gate structures DG of the dummy gate pattern sets EP1 and EP2 are free from contacting the via plugs 540, and are free from electrically connecting to other elements in the semiconductor device. That is, the dummy gate structures DG of the dummy gate pattern sets EP1 and EP2 are electrically floating.

Figure 10:
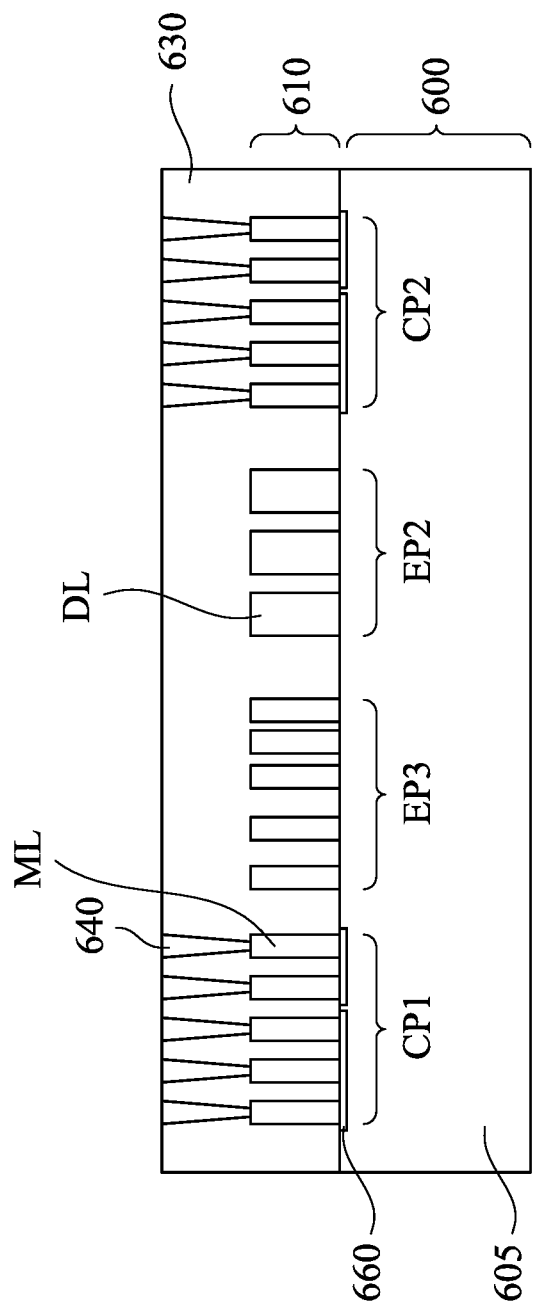
FIG. 10 illustrates a cross-sectional view of a semiconductor device according to an embodiment of the present disclosure.

FIG. 10 is a cross-sectional view of an interconnection structure of a semiconductor device in accordance with some embodiments of the present disclosure. Shown there is an interconnection layer 600. In some embodiments, the interconnection layer 600 may include dielectric layer 605 and metal wiring in the dielectric material. For example, the interconnection layer 600 may include metal lines 660 disposed in the dielectric layer 605. In some embodiments, the dielectric layer 605 may include silicon oxide, silicon nitride, silicon oxynitride, phosphosilicate glass (PSG), borophosphosilicate glass (BPSG), low-k dielectric material, and/or other suitable dielectric materials. The metal lines 660 may include Ti, W, Co, Cu, Al, Mo, MoW, W, TiN, TaN, WN, combinations thereof, or other suitable conductive material.

A conductive layer 610 is formed over the interconnection layer 600. For example, the conductive layer 610 includes main pattern sets CP1 and CP2, and dummy pattern sets EP2 and EP3. In some embodiments, each of the main gate pattern sets CP1 and CP2 includes a plurality of metal lines ML, in which metal lines ML are part of the functional circuitry. That is, the metal lines ML may provide circuit function in a final structure of a semiconductor device. On the other hand, each of the dummy pattern sets EP2 and EP3 includes a plurality of dummy metal lines DL, in which the dummy metal lines DL are not a part of the functional circuitry. That is, the dummy metal lines DL do not provide circuit function in a final structure of a semiconductor device. Accordingly, the dummy pattern sets EP2 and EP3 of the conductive layer 610 are not in contact with the metal lines 660 of the interconnection layer 600. That is, an entirety of the bottom surfaces of the dummy pattern sets EP2 and EP3 of the conductive layer 610 is in contact with the dielectric layer 605 of the interconnection layer 600.

In some embodiments, the main pattern sets CP1 and CP2, and dummy pattern sets EP2 and EP3 may be formed by the method described in FIGS. 7A to 7C. For example, a metal layer may be formed on the interconnection layer 600, and the metal layer is then patterned by using a photomask described in FIGS. 1 to 8. For example, the metal layer is patterned by using a photomask having the layout of FIG. 6A, and the main gate pattern sets CP1 and CP2, and dummy gate pattern sets EP2 and EP3 have similar profile as the main pattern sets CP1 and CP2, and dummy pattern sets EP2 and EP3 described in FIG. 7C. It is noted that, the dummy pattern sets on the interconnection layer 600 may also have the profiles as described in FIGS. 6B to 6G. That is, the dummy pattern sets DP1 to DP6 of FIGS. 6B to 6G may be transferred to the patterned metal layer by using a photomask having the layouts of the dummy pattern sets DP1 to DP6 of FIGS. 6B to 6G.

A dielectric layer 630 may be formed over the interconnection layer 600. In some embodiments, the ILD layer 630 may include silicon oxide, silicon nitride, silicon oxynitride, phosphosilicate glass (PSG), borophosphosilicate glass (BPSG), low-k dielectric material, and/or other suitable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. In some embodiments, the ILD layer 630 may be formed by suitable deposition process, such as CVD, PVD, ALD, or the like.

Via plugs 640 are formed in the dielectric layer 630 to contact the main pattern sets CP1 and CP2 of the patterned conductive layer 410, which are part of the functional circuitry. In contrast, no via plug is formed on the dummy pattern sets EP2 and EP3 of the conductive layer 510, and thus the dummy pattern sets EP2 and EP3 of the conductive layer 510 are electrically floating in some embodiments. That is, in the final structure, there may be no via or plug that are electrically connected to the dummy pattern sets of the conductive layer 510. For example, layers above or below the conductive layer 510 may not include via or plug that is electrically connected to the dummy pattern sets EP2 and EP3 of the conductive layer 510. Stated another way, an entirety of surfaces of the dummy pattern sets EP2 and EP3 of the conductive layers 510 is covered by an insulating material (e.g., the dielectric layer 605 and the dielectric layer 630).

In some embodiments, the structure shown in FIG. 10 may be formed over the structure of FIG. 9. In some embodiments, the structure of FIG. 9 may be a front-end-of-line (FEOL) that includes at least one transistor disposed over a substrate. In some embodiments, the structure of FIG. 10 may be a back-end-of-line (BEOL) that includes interconnection structure disposed over the transistor of FEOL.

Figure 11:
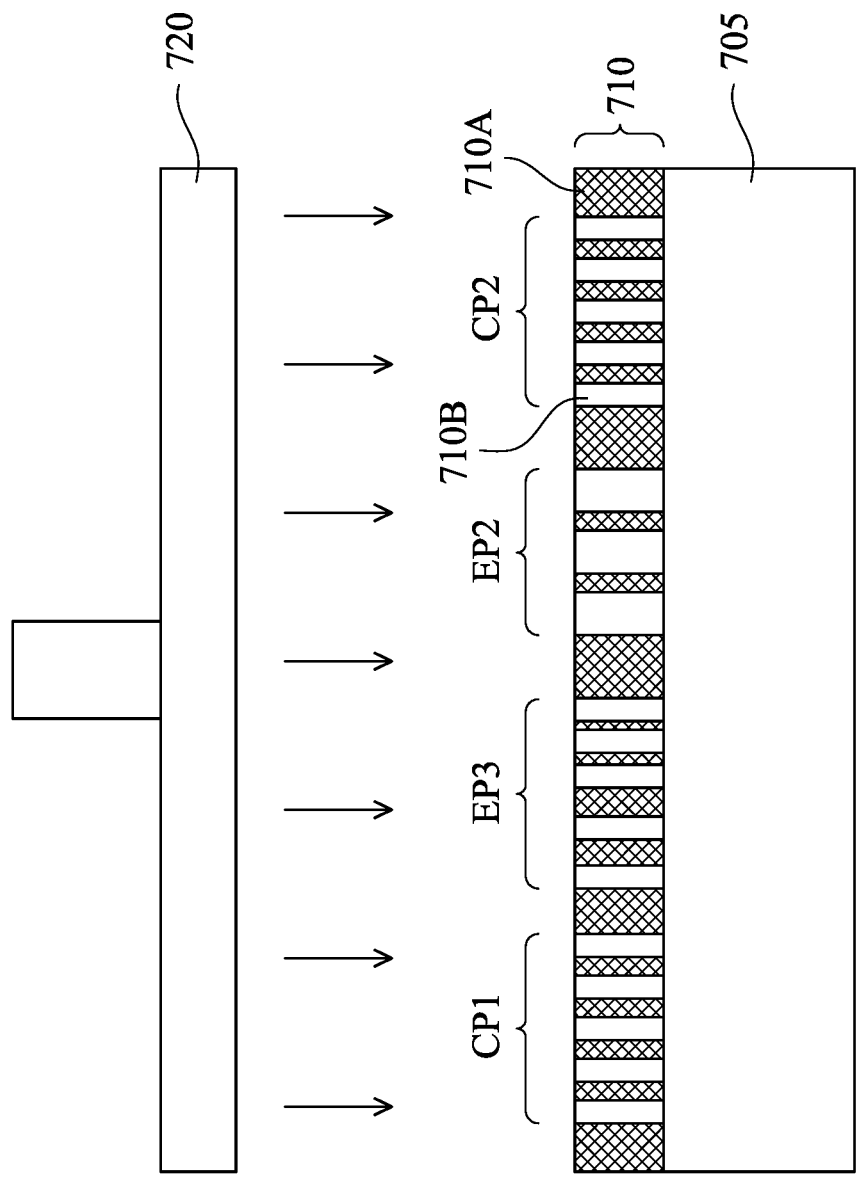
FIG. 11 is a cross-sectional view of performing a CMP process with some embodiments of the present disclosure.

FIG. 11 is a cross-sectional view of performing a CMP process with some embodiments of the present disclosure. Shown there is a substrate 705. In some embodiments, the substrate 705 may be similar to the substrate 405 discussed in FIG. 7A.

A material layer 710 is formed over the substrate 705. In some embodiments, the material layer 710 may include a first material 710A and a second material 710B extending through the first material 710A. In some embodiments, the first material 710A and the second material 710B are made of different materials. For example, the first material 710A may be a dielectric material, and the second material 710B may be a metal. Alternatively, the first material 710A may be a metal, and the second material 710B may be a dielectric material. Alternatively, the first material 710A and the second material 710B are both dielectric material but with different compositions. Alternatively, the first material 710A and the second material 710B are both metal but with different compositions.

In some embodiments, the second material 710B includes main pattern sets CP1 and CP2, and dummy pattern sets EP2 and EP3, in which the main pattern sets CP1 and CP2 and the dummy pattern sets EP2 and EP3 may be designed using the method described in FIGS. 4 to 6G. For example, a layer of the second material 710B may be formed on substrate 705, and the layer of the second material 710B is then patterned by using a photomask described in FIGS. 1 to 8. For example, the layer of the second material 710B may be patterned by using a photomask having the layout of FIG. 6A, and the main pattern sets CP1 and CP2, and dummy pattern sets EP2 and EP3 have similar profile as the main pattern sets CP1 and CP2, and dummy pattern sets EP2 and EP3 described in FIG. 7C. It is noted that, the dummy pattern sets of the second material 710B on the substrate 705 may also have the profiles as described in FIGS. 6B to 6G. That is, the dummy pattern sets DP1 to DP6 of FIGS. 6B to 6G may be transferred to the layer of second material 710B of the material layer 710 by using a photomask having the layouts of the dummy pattern sets DP1 to DP6 of FIGS. 6B to 6G.

A CMP process is performed to planarize top surfaces of the first material 710A and the second material 710B of the material layer 710. In some embodiments, a CMP process may be performed by, for example, introducing a slurry over a polishing pad 720, rotating the polishing pad 720, and then pressing the surface of the material layer 710 against the polishing pad 720. As a result, top surfaces of the first material 710A and the second material 710B of the material layer 710 are substantially coplanar. In some other embodiments, top surfaces of the main pattern sets CP1 and CP2 of the second material 710B, and top surfaces of the dummy pattern sets EP2 and EP3 of the second material 710B are substantially coplanar.

In some embodiments, the dummy pattern sets (e.g., dummy pattern sets EP2 and EP3) inserted in the second material 710B may provide advantages. In some embodiments where the dummy pattern sets are omitted, there may be several empty regions over the substrate 405 that are not covered by the patterns of the second material 710B, and the second material 710B would have non-uniform pattern density. That is, a large area of first material 710A will subject to the CMP process. This will result in different polishing rates at different regions over the substrate 705, and will deteriorate the reliability of the CMP process. Accordingly, by inserting the dummy pattern sets in the photomask, the pattern density of the second material 710B can be balanced, and the polishing rates at different regions over the substrate 705 can be balanced. Accordingly, reliability of the CMP process can be improved.

According to the aforementioned embodiments, it can be seen that the present disclosure offers advantages in fabricating semiconductor devices. It is understood, however, that other embodiments may offer additional advantages, and not all advantages are necessarily disclosed herein, and that no particular advantage is required for all embodiments. One advantage is that dummy pattern sets are inserted in a layout of a photomask, and the dummy pattern sets can lead to favorable aberration through heating effect. Another advantage is that the dummy pattern sets may be transferred to a layer on a wafer, and the transferred dummy pattern sets can balance the pattern density and improve reliability of the manufacturing process, such as an etching process or a CMP process.

In some embodiments of the present disclosure, a method comprises generating an original layout having main pattern sets; simulating a first energy distribution of the original layout on a pupil plane of a lithography system, wherein the first energy distribution has a first wavefront; generating a first modified layout by inserting dummy pattern sets in regions of the original layout that are not occupied by the main pattern sets; simulating a second energy distribution of the first modified layout on a pupil plane of a lithography system; determining whether a second wavefront of the simulated second energy distribution is more homogeneous than the first wavefront of the first energy distribution; and performing a first lithography process using a first photomask having the first modified layout in response to second wavefront of the simulated second energy distribution being determined as more homogeneous than the first wavefront of the first energy distribution.

In some embodiments of the present disclosure, a method comprises generating an original layout having main pattern sets; generating a first modified layout by inserting dummy pattern sets in regions of the original layout that are not occupied by the main pattern sets, wherein each of the dummy pattern sets comprises line patterns, and the line patterns of a first set of the dummy pattern sets are different from the line patterns of a second set of the dummy pattern sets in line width or in line pitch; simulating, based on the first modified layout, a critical dimension (CD) uniformity when the first modified layout is used in a lithography system; determining whether the simulated CD uniformity satisfy a predetermined specification; and in response to the simulated CD uniformity being determined as satisfying the predetermined specification, patterning a conductive layer by using a first photomask having the first modified layout to transfer the main pattern sets and the dummy pattern sets of the first modified layout to the conductive layer.

In some embodiments of the present disclosure, a method comprises generating an original layout having main pattern sets; generating a modified layout by inserting dummy pattern sets in regions of the original layout that are not occupied by the main pattern sets, such that a pattern density of the modified layout is greater than a pattern density of the original layout; forming a transistor over a substrate; forming a conductive layer over a substrate; and patterning the conductive layer, by using a photomask having the modified layout, to transfer the main pattern sets and the dummy pattern sets of the modified layout to the conductive layer, wherein the main pattern sets of the patterned conductive layer are electrically connected to the transistor, and the dummy pattern sets of the patterned conductive layer are electrically floating.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
generating an original layout having main pattern sets;
simulating a first energy distribution of the original layout on a pupil plane of a lithography system, wherein the first energy distribution has a first wavefront;
generating a first modified layout by inserting dummy pattern sets in regions of the original layout that are not occupied by the main pattern sets;
simulating a second energy distribution of the first modified layout on the pupil plane of the lithography system;
determining whether a second wavefront of the second energy distribution is more homogeneous than the first wavefront of the first energy distribution; and
performing a first lithography process using a first photomask having the first modified layout in response to second wavefront of the second energy distribution being determined as more homogeneous than the first wavefront of the first energy distribution.

2. The method of claim 1, further comprising:
determining whether the first wavefront of the first energy distribution has an inhomogeneous wavefront, wherein generating the first modified layout is performed in response to the first wavefront being determined as inhomogeneous.

3. The method of claim 1, further comprising:
generating a second modified layout by changing numbers or positions of the dummy pattern sets in the first modified layout in response to the second wavefront of the second energy distribution being determined as less homogeneous than the first wavefront of the first energy distribution;
simulating a third energy distribution of the second modified layout on the pupil plane of the lithography system;
determining whether a third wavefront of the third energy distribution is more homogeneous than the second wavefront of the second energy distribution; and performing a second lithography process using a second photomask having the second modified layout in response to the third energy distribution being determined as more homogeneous than the second wavefront of the second energy distribution.

4. The method of claim 3, wherein generating the second modified layout is performed without changing the main pattern sets in the first modified layout.

5. The method of claim 1, wherein the lithography system is an EUV lithography system, and simulating the second energy distribution of the first modified layout on the pupil plane of the lithography system comprises:
calculating a near field light distribution by applying a Maxwell equation to a pattern of the first modified layout; and
performing a Fourier Transform to the near field light distribution.

6. The method of claim 1, wherein the lithography system is a DUV lithography system, and simulating the second energy distribution of the first modified layout on the pupil plane of the lithography system comprises performing a Fourier Transform to a pattern of the first modified layout.

7. The method of claim 1, wherein each of the dummy pattern sets comprises line patterns, and the line patterns of a first set of the dummy pattern sets are different from the line patterns of a second set of the dummy pattern sets in line width or in line pitch.

8. The method of claim 1, wherein,
each of the dummy pattern sets comprises first line patterns,
each of the main pattern sets comprises second line patterns, and
the first line patterns of each of the dummy pattern sets are different from the second line patterns of each of the main pattern sets in line width or in line pitch.

9. The method of claim 1, further comprising:
forming a transistor over a substrate;
forming a layer over the substrate; and
patterning the layer, by using the first photomask having the first modified layout, to transfer the main pattern sets and the dummy pattern sets of the first modified layout to the layer.

10. A method, comprising:
generating an original layout having main pattern sets;
simulating a first energy distribution of the original layout on a pupil plane of a lithography system;
simulating a first critical dimension (CD) uniformity based on the first energy distribution;
determining whether the first CD uniformity satisfies a pre-determined value;
when the first CD uniformity does not satisfy the pre-determined value, generating a first modified layout by inserting dummy pattern sets in regions of the original layout that are not occupied by the main pattern sets;
simulating a second energy distribution of the first modified layout on the pupil plane of the lithography system;
simulating a second CD uniformity based on the second energy distribution;
determining whether the second CD uniformity satisfies the pre-determined value; and
when the second CD uniformity satisfies the pre-determined value, performing a first lithography process using a first photomask having the first modified layout.

11. The method of claim 10, further comprising:
generating a second modified layout by changing numbers or positions of the dummy pattern sets in the first modified layout when the second CD uniformity does not satisfy the pre-determined value;
simulating a third energy distribution of the second modified layout on the pupil plane of the lithography system;
simulating a third CD uniformity based on the third energy distribution;
determining whether the third CD uniformity satisfies the pre-determined value; and
when the third CD uniformity satisfies the pre-determined value, performing a second lithography process using a second photomask having the second modified layout.

12. The method of claim 11, wherein generating the second modified layout is performed without changing the main pattern sets in the first modified layout.

13. The method of claim 10, wherein,
each of the dummy pattern sets comprises first line patterns,
each of the main pattern sets comprises second line patterns, and
the first line patterns of each of the dummy pattern sets are different from the second line patterns of each of the main pattern sets in line width or in line pitch.

14. The method of claim 10, wherein each of the dummy pattern sets comprises line patterns, and the line patterns of a first set of the dummy pattern sets are different from the line patterns of a second set of the dummy pattern sets in line width or in line pitch.

15. The method of claim 10, wherein the first energy distribution is determined as acceptable when the first energy distribution is homogeneous.

16. A method, comprising:
generating an original layout having main pattern sets;
simulating a first energy distribution of the original layout on a pupil plane of a lithography system;
determining whether the first energy distribution is homogeneous or inhomogeneous;
when the first energy distribution is inhomogeneous, generating a modified layout by inserting dummy pattern sets in regions of the original layout that are not occupied by the main pattern sets;
simulating a second energy distribution of the modified layout on the pupil plane of the lithography system;
determining whether the second energy distribution is homogeneous or inhomogeneous; and
performing a lithography process using a photomask having the modified layout when the second energy distribution is homogeneous.

17. The method of claim 16, further comprising:
forming a transistor over a substrate;
forming a conductive layer over the substrate; and
patterning the conductive layer, by using the photomask having the modified layout, to transfer the main pattern sets and the dummy pattern sets of the modified layout to the conductive layer.

18. The method of claim 17, wherein the main pattern sets of the patterned conductive layer are electrically connected to the transistor, and the dummy pattern sets of the patterned conductive layer are electrically floating.

19. The method of claim 17, further comprising forming via plugs over the patterned conductive layer, the via plugs are in contact with the main pattern sets of the patterned conductive layer, and the dummy pattern sets of the patterned conductive layer are separated from the via plugs.

20. The method of claim 17, wherein the main pattern sets of the patterned conductive layer form a functional circuit, and the dummy pattern sets of the patterned conductive layer do not form a circuit.

* * * * *